United States Patent
Naoi et al.

(10) Patent No.: US 6,780,527 B2
(45) Date of Patent: Aug. 24, 2004

(54) DECORATIVE ARTICLE HAVING WHITE FILM AND PRODUCTION METHOD THEREFOR

(75) Inventors: Koichi Naoi, Nishitokyo (JP); Akiyoshi Takagi, Nishitokyo (JP); Yukio Miya, Nishitokyo (JP); Fumio Tase, Nishitokyo (JP); Kazumi Hamano, Nishitokyo (JP)

(73) Assignee: Citizen Watch Co., Ltd., Tokyo (JP)

( * ) Notice: Subject to any disclaimer, the term of this patent is extended or adjusted under 35 U.S.C. 154(b) by 57 days.

(21) Appl. No.: 10/069,625

(22) PCT Filed: Jun. 15, 2001

(86) PCT No.: PCT/JP01/05130
§ 371 (c)(1),
(2), (4) Date: Feb. 26, 2002

(87) PCT Pub. No.: WO02/00958
PCT Pub. Date: Jan. 3, 2002

(65) Prior Publication Data
US 2003/0059634 A1 Mar. 27, 2003

(30) Foreign Application Priority Data
Jun. 27, 2000 (JP) .................................. 2000-192077

(51) Int. Cl.$^7$ .......................... B32B 15/04; B32B 15/18; A44C 25/00; C23C 14/00

(52) U.S. Cl. ...................... 428/685; 428/472; 428/674; 428/672; 204/192.15; 204/192.38; 63/34; 427/531; 427/456; 427/259

(58) Field of Search .................. 204/192.11, 192.1, 204/192.12, 192.15, 192.38, 192.26, 192.27; 63/34; 428/671, 672, 673, 627, 685, 667, 681, 684, 687, 457, 542.2, 674, 676, 634, 653, 670, 669; 427/455, 456, 531, 576, 585, 250, 404, 430.1, 436, 259; 205/238

(56) References Cited

U.S. PATENT DOCUMENTS

| | | | | |
|---|---|---|---|---|
| 3,778,238 A | * | 12/1973 | Tyler et al. ................. | 29/196.3 |
| 4,646,935 A | * | 3/1987 | Ulam .......................... | 220/453 |
| 4,666,743 A | * | 5/1987 | Ohta et al. .................. | 427/265 |
| 5,952,112 A | * | 9/1999 | Spring ........................ | 428/653 |
| 6,267,830 B1 | * | 7/2001 | Groll .......................... | 148/531 |

* cited by examiner

*Primary Examiner*—Michael La Villa
(74) *Attorney, Agent, or Firm*—Webb Ziesenheim Logsdon Orkin & Hanson, P.C.

(57) ABSTRACT

The present invention includes a personal ornament having a white coating layer and a method for making the same. The base article is made of metal and the white-colored stainless steel coating layer is formed by a dry plating process. The base metal may be ferrous or non-ferrous.

44 Claims, 1 Drawing Sheet

DECORATIVE ARTICLE HAVING WHITE FILM AND PRODUCTION METHOD THEREFOR

TECHNICAL FIELD

The present invention relates to a personal ornament having a white coating layer, and a process for producing the same. More particularly, the present invention relates to a low-priced personal ornament having an inexpensive white-colored stainless steel coating layer excellent in long-term corrosion resistance on the surface of a base article made of a less corrosive metal or alloy thereof; and a process for producing the personal ornament.

BACKGROUND OF THE INVENTION

Heretofore, many personal ornaments such as watches, necklaces, pendants, and brooches are made from a copper alloy owing to workability, material cost, and other reasons.

However, a personal ornament made from a copper alloy, which is less corrosion-resistant, as the base material is usually covered with a plating layer formed by wet plating to protect the base material from corrosion. This plating layer is usually constituted of an underlying nickel plating layer formed by wet plating and an outermost plating layer formed thereon by wet plating. For making the outermost layer golden in color, a gold plating layer is formed on the nickel layer by wet plating. For making the outermost layer white in color tone, a palladium plating layer, a palladium alloy plating layer, or a rhodium plating layer is formed on the nickel layer by wet plating. The plating layer is generally formed in a thickness ranging from 1 to 5 $\mu$m.

The aforementioned personal ornaments, however, have disadvantage of high cost owing to the noble metal-containing outermost plating layer for corrosion resistance. Therefore, low-priced personal ornaments naturally have a thin outermost plating layer, lacking in long-term corrosion resistance. Moreover, in the production of the low-priced ornaments, the noble metal plating bath should be strictly controlled and maintained in order to obtain stably a thin outermost plating layer, and the workers for the plating operation should have high skill in order to obtain stably the outermost plating layer of the desired color tone. Furthermore, a personal ornament having a characteristic white color of the stainless steel has not yet been produced at a low price.

Accordingly, there are demanded a low-priced personal ornament having an inexpensive white-colored stainless steel coating layer excellent in long-term corrosion resistance on the surface of a base article made of a less corrosive metal or alloy thereof; and a process for producing the personal ornament.

The present invention has been made to solve the problems of the aforementioned prior art techniques, and an object of the present invention is to provide a low-priced personal ornament having an inexpensive white-colored stainless steel coating layer excellent in long-term corrosion resistance on the surface of a base article made of a less corrosive metal or alloy thereof; and a process for producing the personal ornament.

SUMMARY OF THE INVENTION

The first personal ornament having a white coating layer of the present invention comprises a base article of the personal ornament made of a metal, and
a white-colored stainless steel coating layer formed by a dry plating process on at least a part of the surface of the base article.

The above base article of the personal ornament is made usually of tungsten carbide or tantalum carbide.

The second personal ornament having a white coating layer of the present invention comprises:

a base article of the personal ornament made of a nonferrous metal,
an underlying plating layer formed on the surface of the base article, and
a white-colored stainless steel coating layer formed by a dry plating process on at least a part of the surface of the underlying plating layer.

The base article of the personal ornament of the second embodiment is made usually of at least one nonferrous metal selected from the group consisting of copper, copper alloys, aluminum, aluminum alloys, zinc, zinc alloys, magnesium, and magnesium alloys.

The first or second personal ornament having a white coating layer of the present invention may have, on the surface of the stainless steel coating layer, a white-colored noble metal coating layer in a thickness ranging from 0.04 to 0.3 $\mu$m formed by a dry plating process.

The underlying plating layer may have a multilayer structure constituted of at least one plating layer formed by a wet plating process, and at least one different plating layer formed by a dry plating process.

The underlying plating layer is preferably a coating layer formed by a wet plating process and composed of at least one metal selected from the group consisting of gold, copper, nickel, chromium, tin, palladium, nickel-phosphorus alloys, nickel alloys excluding nickel-phosphorus alloys, copper-tin-palladium alloys, copper alloys excluding copper-tin-palladium alloys, tin alloys excluding copper-tin-palladium alloys, and palladium alloys excluding copper-tin-palladium alloys.

The nickel-phosphorus alloy plating layer as the underlying plating layer is preferably a hard coating layer having been treated for age hardening.

For prevention of development of nickel allergy, the underlying plating layer preferably contains no nickel. Such an underlying plating layer is composed preferably of at least one nickel-free metal selected from the group consisting of gold, copper, chromium, tin, palladium, copper-tin-palladium alloys, copper alloys excluding copper-tin-palladium alloys, tin alloys excluding copper-tin-palladium alloys, and palladium alloys excluding copper-tin-palladium alloys, and is formed by a wet plating process.

The underlying plating layer is preferably a coating layer formed by a dry plating process and is composed of titanium carbide, zirconium carbide, or tantalum carbide.

The entire thickness of the underlying plating layer is usually in the range of from 0.2 to 30 $\mu$m.

In the first and second personal ornament having a white coating layer of the present invention, the white-colored stainless steel coating layer is composed preferably of an austenitic stainless steel, particularly an austenitic stainless steel having a composition of 0.01–0.12 vol % of carbon, 0.1–1.0 vol % of silicon, 1.0–2.5 vol % of manganese, 8–22 vol % of nickel, and 15–26 vol % of chromium.

For prevention of development of nickel allergy, the white-colored stainless steel layer preferably contains no nickel. Such a white-colored stainless steel coating layer is composed preferably of a nickel-free ferritic stainless steel, particularly nickel-free ferritic stainless steels having a composition of 0.01–0.12 vol % of carbon, 0.1–1.0 vol % of silicon, 1.0–2.5 vol % of manganese, 14–20 vol % of chromium, and 0.4–2.5 vol % of molybdenum.

The above white-colored stainless steel coating layer can be formed by a dry plating process selected from a sputtering method, an arc evaporation method or an ion-plating method.

In the first or second personal ornament having a white coating layer of the present invention, on the surface of the base article or of the underlying plating layer, at least one plating layer different in color tone from the white-colored stainless steel coating layer may be formed by a dry plating process in addition to the stainless steel coating layer formed by a dry plating process.

The plating layer different from the stainless steel coating layer is preferably a coating layer composed of gold, a gold alloy, titanium nitride, or zirconium nitride.

The first process for producing a personal ornament having a white coating layer of the present invention comprises the steps of:

forming a base article of the personal ornament from a metal (or an alloy) by machining,
washing and degreasing the surface of the base article,
setting the base article in a dry plating apparatus selected from sputtering systems (apparatuses), arc evaporation systems (apparatuses), and ion-plating systems (apparatuses), and cleaning the base article by bombard cleaning in an argon gas atmosphere, and
forming a white-colored stainless steel coating layer on the base article by a dry plating process.

The metal employed for forming the base article of the above personal ornament is usually tungsten carbide or tantalum carbide.

The second process for producing a personal ornament having a white coating layer of the present invention comprises the steps of:

forming a base article of the personal ornament from a nonferrous metal (or an alloy) by machining;
washing and degreasing the surface of the base article;
forming on the surface of the base article an underlying plating layer by a wet plating process or a dry plating process;
setting the base article having the underlying plating layer in a dry plating apparatus selected from sputtering systems, arc evaporation systems, and ion-plating systems, and cleaning the surface of the underlying plating layer by bombard cleaning in an argon gas atmosphere; and
forming a white-colored stainless steel coating layer by a dry plating process on the surface of the underlying plating layer.

The nonferrous metal employed for forming the base article of the above personal ornament is at least one nonferrous metal selected from the group consisting of copper, copper alloys, aluminum, aluminum alloys, zinc, zinc alloys, magnesium, and magnesium alloys.

In the first or second process for producing a personal ornament having a white coating layer of the present invention, the process may further comprise, after the step of forming the white-colored stainless steel coating layer, a step of forming a white-colored noble metal coating layer in a thickness ranging from 0.04 to 0.3 µm on the surface of the stainless steel coating layer by a dry plating process.

The underlying plating layer may have a multilayer structure constituted of at least one plating layer formed by a wet plating process on the surface of the base article, and at least one plating layer formed thereon by a dry plating process.

The underlying plating layer is preferably formed by a wet plating process from at least one metal selected from the group consisting of gold, copper, nickel, chromium, tin, palladium, nickel-phosphorus alloys, nickel alloys excluding nickel-phosphorus alloys, copper-tin-palladium alloys, copper alloys excluding copper-tin-palladium alloys, tin alloys excluding copper-tin-palladium alloys, and palladium alloys excluding copper-tin-palladium alloys.

In the case where a nickel-phosphorus alloy is employed as the underlying plating layer, the nickel-phosphorus alloy plating layer is preferably treated for age hardening at 200 to 450° C. for 20 to 60 minutes to harden the nickel-phosphorus alloy plating layer.

For prevention of development of nickel allergy, the underlying plating layer is preferably formed by a wet plating process from at least one nickel-free metal selected from the group consisting of gold, copper, chromium, tin, palladium, copper-tin-palladium alloys, copper alloys excluding copper-tin-palladium alloys, tin alloys excluding copper-tin-palladium alloys, and palladium alloys excluding copper-tin-palladium alloys.

The underlying plating layer is preferably formed from titanium carbide, zirconium carbide, or tantalum carbide by a dry plating process.

The entire thickness of the underlying plating layer is usually in the range of 0.2 to 30 µm.

In the first and second process of forming a personal ornament having a white coating layer of the present invention, the white-colored stainless steel coating layer is preferably an austenitic stainless steel, particularly an austenitic stainless steel having a composition of 0.01–0.12 vol % of carbon, 0.1–1.0 vol % of silicon, 1.0–2.5 vol % of manganese, 8–22 vol % of nickel, and 15–26 vol % of chromium, and is formed by a sputtering method, an arc evaporation method, or an ion plating method.

For prevention of nickel allergy, the white-colored stainless steel preferably contains no nickel. Such a white-colored stainless steel coating layer is composed preferably of a ferritic stainless steel not containing nickel, particular a ferritic stainless steel not containing nickel having a composition of 0.01–0.12 vol % of carbon, 0.10–1.0 vol % of silicon, 1.0–2.5 vol % of manganese, 14–20 vol % of chromium and 0.4–2.5 vol % of molybdenum, and is formed by a sputtering method, an arc evaporation method or an ion plating method.

The first or second process for producing a personal ornament having a white coating layer of the present invention further comprises, after the steps of forming a white-colored stainless steel coating layer on the surface of the ornament base article or of the underlying coating layer, at least once the steps of masking a part of the stainless steel coating layer, forming a plating layer different in color tone from the stainless steel coating layer on the surface of the stainless steel coating layer and the surface of the mask by a dry plating process, and removing the mask and the coating layer on the mask, to thereby provide an outermost plating layer (finish-plating layer) having a white-colored stainless steel coating layer portion and at least one plating layer portion different in color tone from the stainless steel coating layer.

The plating layer different in color tone from the stainless steel coating layer is preferably obtained by forming at least one coating layer from a metal selected from the group consisting of gold, gold alloys, titanium nitride, hafnium nitride, and zirconium nitride by a dry plating process selected from sputtering methods, arc evaporation methods, and ion plating methods.

DETAILED DESCRIPTION OF THE INVENTION

Figure 1:
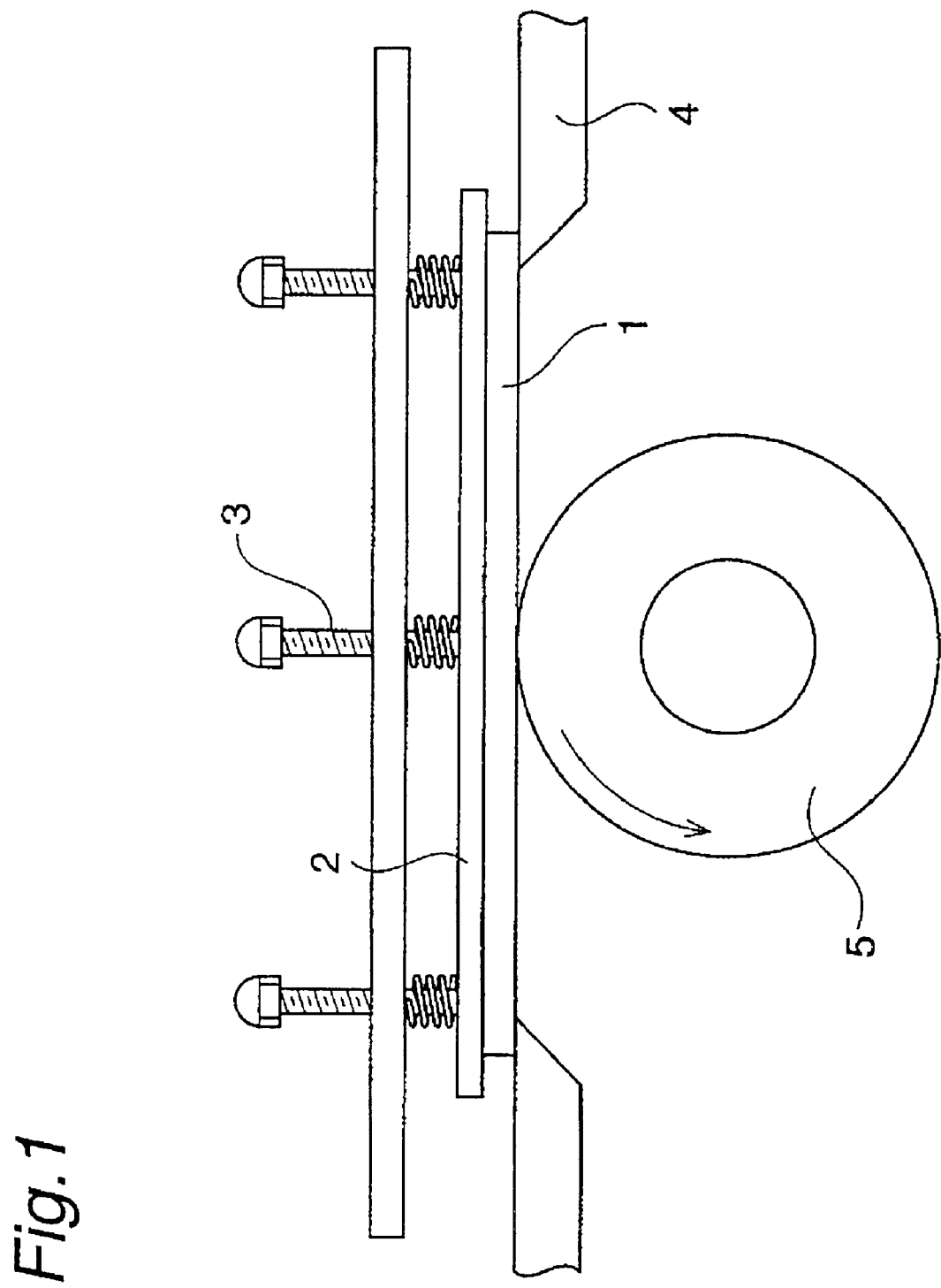
FIG. 1 is a schematic illustration of an abrasion resistance tester for explaining the method of the abrasion resistance test.

The personal ornament having a white coating layer and the process for producing the personal ornament of the present invention are described below in more detail.

The first personal ornament having a white coating layer of the present invention is constituted of a base article of the personal ornament and a white-colored stainless steel coating layer as the outermost coating layer (finish-plating layer).

The second personal ornament having a white coating layer of the present invention is constituted of a base article of the personal ornament, an underlying plating layer, and a white-colored stainless steel coating layer as the outermost coating layer (finish-plating layer).

The first process for producing a personal ornament having a white coating layer of the present invention produces the aforementioned first personal ornament having a white coating layer. The second process for producing a personal ornament having a white coating layer of the present invention produces the aforementioned second personal ornament having a white coating layer.

The present invention includes a personal ornament having an outermost coating layer entirely formed of a stainless steel coating layer, or another personal ornament having an outermost coating layer formed of a stainless steel layer to one portion and of one or more plating layer(s) different in color tone from the stainless steel coating layer to another portion.

Base Article of Personal Ornament

A base article used for the first personal ornament having a white coating layer is formed usually from tungsten carbide, or tantalum carbide.

Another base article used for the second personal ornament having a white coating layer is formed usually from at least one nonferrous metal selected from the group consisting of copper, copper alloys, aluminum, aluminum alloys, zinc, zinc alloys, magnesium, and magnesium alloys.

The base article of a personal ornament (hereinafter referred to "ornament base article") is shaped from the above metal or nonferrous metal by a conventional machining process.

The personal ornaments (and parts thereof) include watchcases, watchbands, watch crowns, watch buckles, belt buckles, finger rings, necklaces, bracelets, earrings, pendants, brooches, cuff buttons, necktie holders, badges, medals, and eyeglass bows.

The first personal ornament having a white coating layer of the present invention has a white-colored stainless steel coating layer formed by a dry plating process directly on the surface of the ornament base article. The second personal ornament having a white coating layer of the present invention has a white-colored stainless steel coating-layer formed by a dry plating process on the surface of the underlying plating layer formed on the surface of the ornament base article.

In the present invention, before forming the stainless steel coating layer or the underlying plating layer on the ornament base article surface, the surface of the ornament base article is preferably washed and degreased by the use of a conventional organic solvent or the like.

Underlying Plating Layer

The underlying plating layer of the second personal ornament having a white coating layer of the present invention is a plating layer formed by a wet plating process or a dry plating process. The underlying plating layer may be of a multilayer structure constituted of one or more plating layers formed by a wet plating process and one or more plating layers formed by a dry plating process.

Examples of the underlying plating layer include:

an underlying plating layer of a two-layer structure constituted of a gold plating layer (flash plating) formed by a wet plating process and a titanium plating layer formed by a dry plating process;

an underlying plating layer of a three-layer structure constituted of a copper plating layer formed by a wet plating process, a copper-tin plating layer formed by a wet plating process, and a titanium carbide plating layer formed by a dry plating process;

an underlying plating layer of a three-layer structure constituted of a palladium plating layer (flash plating), a titanium plating layer formed by a dry plating process, and a titanium carbide plating layer formed by a dry plating process;

an underlying plating layer of a four-layer structure constituted of a copper-tin alloy plating layer formed by a wet plating process, a copper-tin-zinc alloy plating layer formed by a wet plating process, a gold strike plating layer formed by a wet plating process, and a titanium plating layer formed by a dry plating process; and an underlying plating layer of a five-layer structure constituted of a copper-tin alloy plating layer formed by a wet plating process, a copper-tin-zinc alloy plating layer formed by a wet plating process, a palladium strike plating layer formed by a wet plating process, a titanium plating layer formed by a dry plating process, and a titanium carbide plating layer formed by a dry plating process.

The underlying plating layer may also be constituted of two or more plating layers formed by a wet plating process on the surface of an ornament base article.

Examples of this type of underlying plating layer include:

an underlying plating layer of a two-layer structure constituted of a nickel strike plating layer (flash plating) and a nickel plating layer;

an underlying plating layer of a two-layer structure constituted of a nickel plating layer, and a nickel-phosphorus alloy plating layer;

an underlying plating layer of a two-layer structure constituted of a copper plating layer and a copper-tin-palladium alloy plating layer;

an underlying plating layer of a two-layer structure constituted of a copper-tin alloy plating layer and a copper-tin-palladium alloy plating layer;

an underlying plating layer of a two-layer structure constituted of a copper-tin alloy plating layer and a copper-tin-zinc alloy plating layer;

an underlying plating layer of a three-layer structure constituted of a copper-tin alloy plating layer, a copper-tin-palladium alloy plating layer, and a gold plating layer (flash plating);

an underlying plating layer of a three-layer structure constituted of a copper-tin alloy plating layer, a copper-tin-zinc alloy plating layer, and a gold strike plating layer;

an underlying plating layer of a three-layer structure constituted of a copper-tin alloy plating layer, a copper-tin-zinc alloy plating layer, and a palladium strike plating layer;

an underlying plating layer of a three-layer structure constituted of a nickel plating layer, a nickel-phosphorus alloy plating layer, and a palladium-nickel alloy plating layer;

an underlying plating layer of a four-layer structure constituted of a nickel strike plating layer (flash plating), a nickel plating layer, a nickel-phosphorus alloy plating layer, and a palladium-nickel alloy plating layer (flash plating);

an underlying plating layer of a four-layer structure constituted of a nickel strike plating layer a (flash plating), a nickel plating layer, a nickel-phosphorus alloy plating layer, and a palladium strike plating layer;

an underlying plating layer of a four-layer structure constituted of a copper plating layer, a copper-tin alloy plating layer, a copper-tin-palladium alloy plating layer, and a palladium plating layer (flash plating); and an underlying plating layer of a four-layer structure constituted of a copper plating layer, a copper-tin alloy plating layer, a copper-tin-zinc alloy plating layer, and a palladium strike plating layer.

The entire thickness of the underlying plating layer ranges usually from 0.2 to 30 $\mu$m, preferably from 0.5 to 30 $\mu$m, more preferably from 5 to 20$\mu$. For example, in the underlying plating layer of a two or more layer structure comprising a copper-tin alloy plating layer and a copper-tin-zinc alloy plating layer, the copper-tin alloy plating layer has a thickness usually ranging from 1 to 5 m$\mu$, and the copper-tin-zinc alloy plating layer has a thickness ranging from 1 to 5 $\mu$m.

The aforementioned underlying plating layer formed by a wet plating process is specifically composed of at least one metal selected from the group consisting of gold, copper, nickel, chromium, tin, palladium, nickel-phosphorus alloys, nickel alloys excluding nickel-phosphorus alloys, copper-tin-palladium alloys, copper alloys excluding copper-tin-palladium alloys, tin alloys excluding copper-tin-palladium alloys, and palladium alloys excluding copper-tin-palladium alloys. The nickel-phosphorus alloy layer is preferably a hard coating layer having been treated for age hardening.

For prevention of development of nickel allergy, the underlying plating layer is preferably formed by a wet plating process and contains no nickel. Specifically, the underlying plating layer is composed preferably of at least one nickel-free metal selected from the group consisting of gold, copper, chromium, tin, palladium, copper-tin-palladium alloys, copper alloys excluding copper-tin-palladium alloys, tin alloys excluding copper-tin-palladium alloys, and palladium alloys excluding copper-tin-palladium alloys.

The nickel alloys excluding nickel-phosphorus alloys include specifically nickel-cobalt alloys, nickel-copper alloys, nickel-iron alloys, nickel-palladium alloys, gold-nickel alloys, and tin-nickel alloys.

The copper alloys excluding copper-tin-palladium alloys include specifically copper-tin-zinc alloys, copper-tin alloys, copper-gold alloys, copper-silver alloys, and copper-gold-silver alloys.

The tin alloys excluding copper-tin-palladium alloys include specifically copper-tin-zinc alloys, copper-tin alloys, palladium-tin alloys, tin-nickel alloys, and tin-gold alloys.

The palladium alloys excluding copper-tin-palladium alloys include specifically palladium-nickel alloys, palladium-cobalt alloys, palladium-silver alloys, palladium-tin alloys, palladium-iron alloys, and palladium-gold alloys.

The underlying plating layer, for example a nickel plating layer, is formed on the surface of the ornament base article by a wet plating process specifically by the use of a plating solution containing nickel metallic ion.

The embodiments of the nickel plating layer in the present invention are described below as examples.

First Embodiment

A first embodiment of the nickel plating layer in the present invention is a bright nickel plating layer formed on the aforementioned base article by electroplating in a bright nickel plating solution (Watt bath). The solution contains 150–400 g/lit., preferably 250–300 g/lit. of nickel sulfate ($NiSO_4.6H_2O$), 20–60 g/lit., preferably 40–50 g/lit. of nickel chloride ($NiCl_2.6H_2O$), 10–50 g/lit., preferably 30–40 g/lit. of boric acid ($H_3BO_3$) and a brightening agent (a commercial product, e.g., Brightener #61 (standard addition amount: 0.5 ml/lit.), #62 (standard addition amount: 4 ml/lit.), and #63 (standard addition amount: 10 ml/lit.), produced by Ebara-Udylite Co., Ltd.).

This plating solution is an acidic solution having a pH of 4.0–4.5, preferably 4.0–4.3. The aforementioned nickel plating layer can be formed by electroplating in the aforementioned plating solution under the conditions of a bath temperature of 40–50° C., and a current density (Dk) of 1–3 A/dm$^2$.

Second Embodiment

A second embodiment of the nickel plating layer in the present invention is a semi-bright nickel plating layer formed on the aforementioned base article by electroplating in a semi-bright nickel plating solution. The solution contains 150–400 g/lit., preferably 250–300 g/lit. of nickel sulfate ($NiSO_4.6H_2O$), 20–60 g/lit., preferably 40–50 g/lit. of nickel chloride ($NiCl_2.6H_2O$), 10–50 g/lit., preferably 30–40 g/lit. of boric acid ($H_3BO_3$) and a semi-brightening agent (a commercial product, e.g., semi-brightener Levenon A (standard addition amount: 5 ml/lit.), produced by Nikko Metal Co.).

This plating solution is an acidic solution having a pH of 4.0–4.5, preferably 4.0–4.3. The aforementioned nickel plating layer can be formed by electroplating in the aforementioned plating solution under the conditions of a bath temperature of 40–50° C., and a current density (Dk) of 1–3 A/dm$^2$.

Third Embodiment

A third embodiment of the nickel plating layer in the present invention is a nickel plating layer formed on the aforementioned base article by electroplating in a nickel strike plating solution. The solution contains 150–300 g/lit., preferably 200–250 g/lit. of nickel chloride ($NiCl_2.6H_2O$) and 100–150 g/lit., preferably 125±10 g/lit. of hydrochloric acid (HCl).

This plating solution is an acidic solution having a pH of lower than 1.0. The aforementioned nickel plating layer can be formed by electroplating in the aforementioned plating solution under the conditions of a bath temperature of 25±2° C., and a current density (Dk) of 3–5 A/dm².

In the case where the underlying plating layer is a nickel-phosphorus alloy plating layer, this plating layer is formed by a wet plating process on the surface of the ornament base article. This plating layer is composed of an amorphous nickel-phosphorus alloy as it is formed, and can be crystallized by age hardening treatment mentioned later to be a hard coating layer. This age hardening treatment may be conducted concurrently with, or after the formation of the outermost coating layer (finish-plating layer). Otherwise, the nickel-phosphorus alloy plating layer may be treated for age hardening after the formation thereof in an ion plating apparatus or a sputtering apparatus before the formation of the outermost coating layer by ion plating or sputtering in the same apparatus.

The phosphorus content in the nickel-phosphorus alloy plating layer ranges preferably from 13 to 15 wt %.

The nickel-phosphorus alloy plating layer is formed, for example, by electroplating the surface of the ornament base article in a plating solution containing 100–200 g/lit., preferably 140–160 g/lit. of nickel sulfate ($NiSO_4.7H_2O$), 10–40 g/lit., preferably 20–30 g/lit. of nickel hydroxide (($Ni(OH)_2.H_2O$), 1–10 g/lit., preferably 4–6 g/lit. of sodium hypophosphite ($NaH_2PO_2.H_2O$), 50–90 ml/lit., preferably 65–75 ml/lit. of phosphoric acid ($H_3PO_4$) and 50–150 g/lit., preferably 90–110 g/lit. of sodium citrate.

This plating solution is an acidic solution having a pH of 2.8–3.2. The nickel-phosphorus alloy plating layer can be formed by electroplating in the aforementioned plating solution under the conditions of a bath temperature of 60–80° C., and a current density (Dk) of 1.0–3.0 A/dm², preferably 2.0±0.2 A/dm².

In the present invention, the nickel-phosphorus alloy plating layer containing a phosphorus content of 13–15 wt % can be formed by selecting the conditions of the hypophosphorus acid concentration in the plating solution, the sodium citrate concentration in the plating solution, the pH of the plating solution, and the current density to be in the range as mentioned above.

The sodium hypophosphite and the phosphoric acid serve as a reducing agent and supply phosphorus for constituting the nickel-phosphorus alloy plating layer.

The nickel hydroxide serves as a pH adjusting agent and the sodium citrate serves as a complexing agent.

On the other hand, the underlying plating layer formed by the aforementioned dry plating process includes preferably white-colored plating layers formed from titanium carbide, zirconium carbide, or tantalum carbide. Before forming such a plating layer, a titanium plating layer may be formed on the surface of the base article or the wet-plated layer. The formation of this titanium plating layer improves the adhesiveness between the base article adjacent to the titanium plating layer and the dry-plated later, or the adhesiveness between the wet-plated layer adjacent to the titanium plating layer and the dry-plated layer.

The dry plating process includes specifically physical vapor deposition (PVD) such as sputtering methods, arc evaporation methods, ion-plating methods, and ion beam processes; and CVD. Of these, sputtering methods, arc evaporation methods, and ion-plating methods are particularly preferred.

Outermost Coating Layer

Stainless Steel Coating Layer

The outermost coating layer constituting the first or second personal ornament having a white coating layer of the present invention has a white-colored stainless steel coating layer formed by a dry plating process on at least a part of the surface of the ornament base article or of the underlying plating layer.

In the present invention, before the formation of the stainless steel coating layer, the surface of the ornament base article or the underlying coating layer is preferably cleaned by a bombard cleaning method in an argon gas atmosphere in a dry plating apparatus selected from sputtering systems, arc evaporation systems, and ion-plating systems.

The white-colored stainless steel coating layer is a plating layer composed preferably of an austenitic stainless steel, particularly an austenitic stainless steel having a composition of 0.01–0.12 vol % of carbon, 0.1–1.0 vol % of silicon, 1.0–2.5 vol % of manganese, 8–22 vol % of nickel, and 15–26 vol % of chromium (e.g., SUS310S, and SUS304 (JIS Standard)).

For prevention of development of nickel allergy, the white colored stainless steel preferably contains no nickel. Such a white-colored stainless steel coating layer is composed preferably of a nickel-free ferritic stainless steel, particularly a nickel-free ferritic stainless steel having a composition of 0.01–0.12 vol % of carbon, 0.1–1.0 vol % of silicon, 1.0–2.5 vol % of manganese, 14–20 vol % of chromium, and 0.4–2.5 vol % of molybdenum (e.g., SUS444 (JIS Standard)).

Before forming such a stainless steel coating layer, a titanium plating layer may be formed by a dry plating process on the surface of the base article or the underlying plated layer. The formation of this titanium plating layer improves the adhesiveness between the base article adjacent to the titanium plating layer and the stainless steel coating layer, or the adhesiveness between the underlying layer adjacent to the titanium plating layer and the stainless steel coating layer.

The dry plating process for forming the stainless steel coating layer includes sputtering methods, arc evaporation methods, and ion-plating methods.

The thickness of the white-colored stainless steel coating layer is in the range of usually 0.1–2.0 μm, preferably 0.2–1.2 μm, more preferably 0.3–0.7 μm.

Plating Layer Different in Color Tone from Stainless Steel Coating Layer

In the first or second personal ornament having a white coating layer of the present invention, at least one plating layer different in color tone from the white colored stainless steel coating layer may be formed by a dry plating process in addition to the white-colored stainless steel coating layer on the surface of the ornament base article or the underlying plating layer.

The personal ornament having, a plating layer, as the outermost coating layer, different in color tone from the white-colored stainless steel coating layer can be produced, for example, through the process below.

First, a white-colored stainless steel coating layer is formed on the surface of the ornament base article or of the underlying coating layer. Then, the steps of masking a part of the surface of the stainless steel coating layer, forming a plating layer different in color tone from the stainless steel coating layer on the surface of the stainless steel coating layer and the surface of the mask by a dry plating process, and removing the mask together with the plating layer thereon are carried out at least one time. Thus, there can be obtained an outermost coating layer of two or more color tones comprising a white-colored stainless steel coating layer portion and at least one plating layer portion different in color tone from the stainless steel coating layer.

The plating layer different in color tone from the stainless steel coating layer is preferably obtained by forming at least one coating layer comprising a metal selected from the group consisting of gold, gold alloys, titanium nitride, and zirconium nitride by a dry plating process selected from a sputtering method, an arc evaporation method, and an ion plating method.

The thickness of the plating layer different in color tone from the stainless steel coating layer is in the range of usually 0.1–1.0 μm, preferably 0.2–0.5 μm.

Noble Metal Coating Layer

The personal ornament having a white coating layer of the present invention may have additionally a white-colored noble metal coating layer in the thickness range of 0.04–0.3 μm, preferably 0.05–0.2 μm formed by a dry plating process on the aforementioned stainless steel coating layer.

This noble metal coating layer is a dry plated layer comprising a noble metal selected from the group consisting of palladium, platinum, rhodium, gold alloys, silver and silver alloys.

The gold alloys include specifically gold-cobalt alloys, gold-palladium alloys and gold-nickel alloys which have a white tone and contain gold at a low content.

The silver alloys include specifically silver-copper alloys, and silver-tin alloys.

The noble metal coating layer is formed extremely thin. Therefore, even the use of expensive palladium does not increase the cost of the personal ornament as it is used in a small amount.

The dry plating process employed for forming the noble metal coating layer is preferably a sputtering method or an ion-plating method.

Age Hardening Treatment

The age hardening treatment to the nickel-phosphorus alloy plating layer which is occasionally used as an underlying plating layer; may be conducted concurrently with the formation of the outermost coating layer (a white-colored stainless steel coating layer or a different-colored plating layer), or after the formation of the outermost coating layer. Otherwise, the age hardening treatment to the nickel-phosphorus alloy plating layer may be conducted after the formation thereof and before the formation of the outermost coating layer, by ion plating, sputtering or arcing in the same apparatus for the ion plating, sputtering, or arcing for the formation of the outermost coating.

The age hardening treatment is conducted at a treatment temperature of usually 200–450° C., preferably 250–430° C., more preferably 300–400° C., for a treatment time of usually 20–60 minutes, preferably 25–55 minutes, more preferably 30–50 minutes.

The age hardening treatment of the nickel-phosphorus alloy plating layer can be conducted concurrently with the formation of the outermost coating layer by selecting the conditions of the ion plating, sputtering or arc evaporation method for the formation of the outermost coating layer so as to coincide with the heat treatment conditions for the above age hardening treatment.

In the case where the conditions of the dry plating process such as an ion plating method for the formation of the outermost coating layer are selected to be lower than the lower limit of the thermal treatment conditions of the above age hardening, the age hardening treatment is to be conducted under the aforementioned thermal treatment conditions after the formation of the surface coating layer.

In the present invention, the age hardening treatment of the nickel-phosphorus alloy plating layer is preferably conducted simultaneously with the formation of the outermost coating layer in view of the productivity. The age hardening treatment is preferably conducted in a vacuum.

When an amorphous nickel-phosphorus alloy plating layer is subjected to age hardening treatment, the amorphous matter in the nickel-phosphorus alloy plating layer is crystallized to turn the nickel-phosphorus alloy plating layer into a hard coating layer.

The present invention provides a white-colored stainless steel coating layer as an outermost coating layer which is inexpensive and is corrosion-resistant for a long term; a low-priced personal ornament having a white-colored noble metal coating layer on the surface of the stainless steel coating layer; and a process for producing the same.

In the present invention, as the outermost coating layer, a plating layer composed of an expensive noble metal such as gold may be formed as a plating layer different in color tone from the stainless steel coating layer in addition to the inexpensive stainless steel coating layer. The formation of the noble metal plating layer on a limited area of the surface of the personal ornament can lower the price of the personal ornament.

EXAMPLES

The present invention is described by reference to examples without limiting the invention in any way.

The corrosion resistance test in the examples was conducted in a manner shown below.

<Corrosion Resistance Test of Plating Layer>

The corrosion resistance test of the plating layer was conducted according to JIS H 8502 (CASS test). The test was continued for 96 hours. The surface of the plating layer after the corrosion test was evaluated to be "good" when the rating number was not lower than 9.8 according to the rating number standard diagram.

Example 1

A base article of a watchcase was shaped from tungsten carbide by machining. This base article was washed and degreased with an organic solvent.

This base article was set in a sputtering apparatus, and the surface of the base article was cleaned by bombard cleaning in an argon atmosphere.

On the surface of this base article, a white-colored stainless steel coating layer was formed in a thickness of 0.2 μm by a sputtering method (magnetron sputtering method) under the layer formation conditions below to obtain a watchcase.

Separately, in the same manner as above, on the surface of another base article, a white-colored stainless steel coating layer was formed in a thickness of 2 μm to obtain another watchcase.

<Layer Formation Conditions>

| Target: | Austenitic stainless steel SUS304 |
|---|---|
| Sputtering gas: | Argon gas |
| Layer formation pressure: | 0.2–0.9 Pa |
| Target power: | 1.0–2.0 kW |
| Bias voltage: | Ground to −300 V |

The resulting watchcases were tested for the corrosion resistance of the plating layer according to the aforementioned method. The rating numbers were not lower than 9.8, showing that the corrosion resistance was "good".

Example 2

A base article of a watchcase was shaped from brass by machining. This base article was washed and degreased with an organic solvent.

This base article was immersed in a plating solution having the composition below. A nickel strike plating layer (flash plating) was formed in a thickness of 0.1–0.2 µm on the base article surface by electroplating under the plating conditions below. The plated article was washed with water.

<<Nickel Strike Plating>>
<Plating Solution Composition>

| Nickel chloride | 180 g/lit. |
|---|---|
| Hydrochloric acid | 100 g/lit. |

<Plating Conditions>

| pH | <1 (specifically 0.3 to less than 1) |
|---|---|
| Solution temperature | Room temperature |
| Current density (Dk) | 3–5 A/dm$^2$ |
| Time | 30–60 seconds |

This watchcase base article having the nickel strike plating layer was immersed in a plating solution having the composition below. A nickel plating layer was formed in a thickness of 2 µm on the nickel strike plating layer surface by electroplating under the plating conditions below. The plated base article was washed with water.

<<Nickel Plating>>
<Plating Solution Composition>

| Nickel sulfate | 250 g/lit. |
|---|---|
| Nickel chloride | 75 g/lit. |
| Boric acid | 50 g/lit. |
| Brightener (Brightener #61, produced by Ebara-Udylite Co., Ltd.) | 0.5 ml/lit. |

<Plating Conditions>

| pH | 3.6–4.0 |
|---|---|
| Solution temperature | 40–50° C. |
| Current density (Dk) | 3 A/dm$^2$ |

This plated base article was set in a sputtering apparatus, and the surface of the base article was cleaned by bombard cleaning in an argon atmosphere.

On the surface of the nickel plating layer formed on this base article, a white-colored stainless steel coating layer was formed in a thickness of 0.5 µm by a sputtering method under the layer formation conditions below to obtain a watchcase.

<Layer Formation Conditions>

| Target: | Austenitic stainless steel SUS304 |
|---|---|
| Sputtering gas: | Argon gas |
| Layer formation pressure: | 0.2–0.9 Pa |
| Target power: | 1.0–2.0 kW |
| Bias voltage: | Ground to −300 V |

The resulting watchcase was tested for the corrosion resistance of the plating layer according to the aforementioned method. The rating numbers were not lower than 9.8, showing that the corrosion resistance was "good".

Example 3

A base article of a watchband was shaped from brass by machining. This base article was washed and degreased with an organic solvent.

This base article was immersed in a plating solution having the composition below. A nickel strike plating layer (flash plating) was formed in a thickness of 0.1–0.2 µm on the base article surface by electroplating under the plating conditions below. The plated article was washed with water.

<Nickel Strike Plating>
<Plating Solution Composition>

| Nickel chloride | 180 g/lit. |
|---|---|
| Hydrochloric acid | 100 g/lit. |

<Plating Conditions>

| pH | <1 (specifically 0.3 to less than 1) |
|---|---|
| Solution temperature | Room temperature |
| Current density (Dk) | 3–5 A/dm$^2$ |
| Time | 30–60 seconds |

This watchband base article having the nickel strike plating was immersed in a plating solution having the composition below. A nickel plating layer was formed in a thickness of 2 µm on the nickel strike plating layer surface by electroplating under the plating conditions below. The plated article was washed with water.

<<Nickel Plating>>
<Plating Solution Composition>

| Nickel sulfate | 250 g/lit. |
|---|---|
| Nickel chloride | 75 g/lit. |
| Boric acid | 50 g/lit. |
| Brightener (Brightener #61, produced by Ebara-Udylite Co., Ltd.) | 0.5 ml/lit. |

<Plating Conditions>

| pH | 3.6–4.0 |
|---|---|
| Solution temperature | 40–50° C. |
| Current density (Dk) | 3 A/dm$^2$ |

This watchband base article having the nickel plating layer was immersed in a plating solution having the composition below. A nickel-phosphorus alloy plating layer was formed in a thickness of 2 μm on the nickel plating layer surface by electroplating under the plating conditions below. The plated base article was washed with water.

<<Nickel-Phosphorus Alloy Plating>>
<Plating Solution Composition>

| | |
|---|---|
| Nickel sulfate | 40–50 g/lit. |
| Nickel hydroxide | 10–20 g/lit. |
| Sodium hypophosphite | 3–10 g/lit. |
| Phosphoric acid | 10–20 ml/lit. |
| Sodium citrate | 30–50 g/lit. |

<Plating Conditions>

| | |
|---|---|
| pH | 2.6–3.2 |
| Solution temperature | 55° C. |
| Current density (Dk) | 2 A/dm$^2$ |

This watchband base article having the nickel-phosphorus alloy plating layer was immersed in a plating solution having the composition below. A palladium-nickel alloy plating layer (flash plating) was formed in a thickness of 0.1–0.2 μm on the nickel-phosphorus plating layer surface by electroplating under the plating conditions below. The plated base article was washed with water, and dried.

<<Palladium-Nickel Alloy Plating>>
<Plating Solution Composition>

| | |
|---|---|
| Palladium | 7.5 g/lit. |
| Nickel | 12.5 g/lit. |

<Plating Conditions>

| | |
|---|---|
| pH | 8 |
| Solution temperature | 32° C. |
| Current density (Dk) | 1.0 A/dm$^2$ |
| Specific gravity (Be) | 12.5 |
| Layer forming rate | 4.2 minutes/1 μm |

This plated base article was set in a sputtering apparatus, and the surface of the base article was cleaned by bombard cleaning in an argon atmosphere.

On the surface of the palladium-nickel alloy plating layer formed on this base article, a white-colored stainless steel coating layer was formed in a thickness of 0.5 μm by a sputtering method under the layer formation conditions below.

<Layer Formation Conditions>

| | |
|---|---|
| Target: | Austenitic stainless steel SUS304 |
| Sputtering gas: | Argon gas |
| Layer formation pressure: | 0.2–0.9 Pa |
| Target power: | 1.0–2.0 kW |
| Bias voltage: | Ground to −300 V |

In this apparatus, the above nickel-phosphorus alloy plating layer was heat-treated (age hardening treatment) at 250° C. for 30 minutes to obtain a watchband.

The obtained watchband had a surface hardness (HV: Vickers hardness, 25 g, impression time of 10 seconds) of 650.

Separately, another watchband was prepared in the same manner as above by forming a white-colored stainless steel coating layer in a thickness of 2 μm, and heat-treating the nickel-phosphorus alloy plating layer under the same conditions as above.

The obtained watchband had a surface hardness (HV: Vickers hardness, 25 g, impression time of 10 seconds) of 650.

The resulting watchbands were tested for the corrosion resistance of the plating layer according to the aforementioned method. The rating numbers were not lower than 9.8, showing that the corrosion resistance was "good".

Example 4

A base article of a watchband was shaped from brass by machining. This base article was washed and degreased with an organic solvent.

The base article was immersed in a plating solution having the composition below. A copper-tin alloy plating layer was formed in a thickness of 2 μm on the base article surface by electroplating under the plating conditions below. The plated article was washed with water.

<<Copper-Tin Alloy Plating>>
<Plating Solution Composition>

| | |
|---|---|
| Copper | 15 g/lit. |
| Tin | 15 g/lit. |
| Zinc | 1 g/lit. |
| Potassium cyanide (free) | 30 ± 2 g/lit. |

<Plating Conditions>

| | |
|---|---|
| pH | 12.7 |
| Solution temperature | 50° C. |
| Current density (Dk) | 2 A/dm$^2$ |
| Layer forming rate | 3 minutes/1 μm |

This watchband base article having the copper-tin alloy plating layer was immersed in a plating solution having the composition below. A copper-tin-palladium alloy plating layer was formed in a thickness of 2 μm on the copper-tin alloy plating layer surface by electroplating under the plating conditions below. The plated base article was washed with water.

<<Copper-Tin-Palladium Alloy Plating>>
<Plating Solution Composition>

| | |
|---|---|
| Sodium stannate trihydrate (Na$_2$SnO$_3$.3H$_2$O) | 60 g/L (26.7 g/lit. in terms of Sn) |
| Copper cyanide (CuCN) | 20 g/L (14.2 g/lit. in terms of Cu) |
| Palladium potassium cyanide hydrate (K$_2$Pd(CN)$_4$.3H$_2$O) | 30 g/L (9.3 g/lit. in terms of Pd) |
| Amidosulfonic acid (NH$_2$SO$_3$H) | 10 g/lit. |
| Potassium cyanide (free) | 30 g/lit. |
| Potassium hydroxide | 60 g/lit. |

<Plating Conditions>

| pH | 12.5–13 |
|---|---|
| Solution temperature | 50–55° C. |
| Current density (Dk) | 2 A/dm$^2$ |
| Layer forming rate | 0.33 μm/minute |

This watchband base article having the copper-tin-palladium alloy plating layer was immersed in a plating solution having the composition below. A gold strike plating layer (flash plating) was formed in a thickness of 0.1–0.2 μm on the copper-tin-palladium alloy plating layer surface by electroplating under the plating conditions below. The plated base article was washed with water.

<<Gold Strike Plating>>

<Plating Solution Composition>

| Gold | 3–5 g/lit. |
|---|---|
| Sulfuric acid | 10 g/lit. |

<Plating Conditions>

| pH | 1< (Specifically 0.3 to less than 1) |
|---|---|
| Solution temperature | 25° C. |
| Current density (Dk) | 3–5 A/dm$^2$ |
| Time | 30 seconds |

This plated base article was set in a sputtering apparatus, and the surface of the base article was cleaned by bombard cleaning in an argon atmosphere.

On the surface of the gold strike plating layer formed on this base article, a white-colored stainless steel coating layer was formed in a thickness of 0.5 μm by a sputtering method under the layer formation conditions below to obtain a watchband.

<Layer Formation Conditions>

| Target: | Nickel-free ferritic stainless steel SUS444 |
|---|---|
| Sputtering gas: | Argon gas |
| Layer formation pressure: | 0.2–0.9 Pa |
| Target power: | 1.0–2.0 kW |
| Bias voltage: | Ground to −300 V |

The resulting watchband was tested for the corrosion resistance of the plating layer according to the aforementioned method. The rating number was not lower than 9.8, showing that the corrosion resistance was "good".

Example 5

A base article of a watchband was shaped from zinc by machining. This base article was washed and degreased with an organic solvent.

This watchband base article was immersed in a plating solution having the composition below. A copper plating layer was formed in a thickness of 8 μm on the base article surface by electroplating under the plating conditions below. The plated article was washed with water.

<<Copper Plating>>

<Plating Solution Composition>

| Copper pyrophosphate | 100 g/lit. |
|---|---|
| Potassium pyrophosphate | 340 g/lit. |
| Ammonium citrate | 10 g/lit. |
| Ammonia | 3 g/lit. |

<Plating Conditions>

| pH | 8.5 |
|---|---|
| Bath temperature | 50° C. |
| Current density (Dk) | 3 A/dm$^2$ |

This base article having the copper plating layer was immersed in a plating solution having the composition below. A copper-tin alloy plating layer was formed in a thickness of 2 μm on the above base article surface by electroplating under the plating conditions below. The plated base article was washed with water.

<<Copper-Tin Alloy Plating>>

<Plating Solution Composition>

| Copper | 15 g/lit. |
|---|---|
| Tin | 15 g/lit. |
| Zinc | 1 g/lit. |
| Potassium cyanide (free) | 30 ± 2 g/lit. |

<Plating Conditions>

| pH | 12.7 |
|---|---|
| Solution temperature | 50° C. |
| Current density (Dk) | 2 A/dm$^2$ |
| Layer forming rate | 3 minutes/1 μm |

This watchband base article having the copper-tin alloy plating layer was immersed in a plating solution having the composition below. A copper-tin-palladium alloy plating layer was formed in a thickness of 2 μm on the copper-tin alloy plating layer surface by electroplating under the plating conditions below. The plated base article was washed with water.

<<Copper-Tin-Palladium Alloy Plating>>

<Plating Solution Composition>

| Sodium stannate trihydrate (Na$_2$SnO$_3$.3H$_2$O) | 60 g/lit. (26.7 g/lit. in terms of Sn) |
|---|---|
| Copper cyanide (CuCN) | 20 g/lit. (14.2 g/lit. in terms of Cu) |
| Palladium potassium cyanide hydrate (K$_2$Pd (CN)$_4$.3H$_2$O) | 30 g/lit. (9.3 g/lit. in terms of Pd) |
| Amidosulfonic acid (NH$_2$SO$_3$H) | 10 g/lit. |
| Potassium cyanide (free) | 30 g/lit. |
| Potassium hydroxide | 60 g/lit. |

<Plating Conditions>

| | |
|---|---|
| pH | 12.5–13 |
| Solution temperature | 50–55° C. |
| Current density (Dk) | 2 A/dm² |
| Layer forming rate | 0.33 μm/minute |

This watchband base article having the copper-tin-palladium alloy plating layer was immersed in a plating solution having the composition below. A palladium strike plating layer (flash plating) was formed in a thickness of 0.2 μm on the copper-tin-palladium alloy plating layer surface by electroplating under the plating conditions below. The plated base article was washed with water.

<<Palladium Strike Plating>>
<Plating Solution Composition>

| | |
|---|---|
| Pure palladium | 1–3 g/lit. |

<Plating Conditions>

| | |
|---|---|
| pH | 8 |
| Solution temperature | 32° C. |
| Current density (Dk) | 3–5 A/dm² |
| Time | 30 seconds |

This plated base article was set in a sputtering apparatus, and the surface of the base article was cleaned by bombard cleaning in an argon atmosphere.

On the surface of the palladium strike plating layer formed on this base article, a white-colored stainless steel coating layer was formed in a thickness of 1.0 μm by a sputtering method under the layer formation conditions below to obtain a watchband.

<Layer Formation Conditions>

| | |
|---|---|
| Target: | Nickel-free ferritic stainless steel SUS444 |
| Sputtering gas: | Argon gas |
| Layer formation pressure: | 0.2–0.9 Pa |
| Target power: | 1.0–2.0 kW |
| Bias voltage: | Ground to −300 V |

The resulting watchband was tested for the corrosion resistance of the plating layer according to the aforementioned method. The rating number was not lower than 9.8, showing that the corrosion resistance was "good".

Example 6

A base article of a watchcase was shaped by machining from a zinc alloy (composition: Al, 3.5–4.3%; Cu, 0.75–1.25%; Mg, 0.02–0.08%; and balance of Zn). This base article was washed and degreased with an organic solvent.

This watch case base article was immersed in a plating solution having the composition below. A copper plating layer was formed in a thickness of 8 μm on the base article surface by electroplating under the plating conditions below. The plated article was washed with water.

<<Copper Plating>>
<Plating Solution Composition>

| | |
|---|---|
| Copper pyrophosphate | 100 g/lit. |
| Potassium pyrophosphate | 340 g/lit. |
| Ammonium citrate | 10 g/lit. |
| Ammonia | 3 g/lit. |

<Plating Conditions>

| | |
|---|---|
| pH | 8.5 |
| Solution temperature | 50° C. |
| Current density (Dk) | 3 A/dm² |

This base article having the copper plating layer was immersed in a plating solution having the composition below. A copper-tin alloy plating layer was formed in a thickness of 2 μm on base article surface by electroplating under the plating conditions below. The plated base article was washed with water.

<<Copper-Tin Alloy Plating>>
<Plating Solution Composition>

| | |
|---|---|
| Copper | 15 g/lit. |
| Tin | 15 g/lit. |
| Zinc | 1 g/lit. |
| Potassium cyanide (free) | 30 ± 2 g/lit. |

<Plating Conditions>

| | |
|---|---|
| pH | 12.7 |
| Solution temperature | 50° C. |
| Current density (Dk) | 2 A/dm² |
| Layer forming rate | 3 minutes/1 μm |

This watch case base article having the copper-tin alloy coating layer was set in an ion plating apparatus, and the surface of the base article was cleaned by bombard cleaning in an argon atmosphere.

On the surface of the copper-tin alloy plating layer formed on this base article surface, a titanium carbide plating layer of a white color tone was formed in a thickness of 0.2 μm by an ion plating process (hot cathode method) under the layer formation conditions below.

<Layer Formation Conditions>

| | |
|---|---|
| Evaporation source: | Titanium |
| Gas: | Gas mixture of $C_2H_4$, $CH_4$ and $C_6H_6$ |
| Layer formation pressure: | 0.15–0.65 Pa |
| Anode voltage: | 40–60 V |
| Bias voltage: | Ground to −200 V |
| Filament current: | 50 A |
| E/B: | 10 kV, 0.25–0.35 mA |

On the surface of the titanium carbide plating layer formed on this base article surface, a stainless steel coating layer of a white color tone was formed in a thickness of 0.3 μm by an ion plating process under the layer formation conditions below.

<Layer Formation Conditions>
Evaporation source:
Nickel-free ferritic stainless steel SUS444

| Gas: | Argon gas |
|---|---|
| Layer formation pressure: | 0.15–0.65 Pa |
| Anode voltage: | 40–50 V |
| Bias voltage: | Ground to −200 V |
| Filament current: | 50 A |
| E/B: | 10 kV, 0.2–0.3 mA |

The resulting watchcase was tested for the corrosion resistance of the plating layer according to the aforementioned method. The rating number was not lower than 9.8, showing that the corrosion resistance was "good".

Example 7

A base article of an earring was shaped by machining a magnesium alloy (composition: Al, 8.3–11.0%; Zn, 0.3–1.0%; Mn, 0.13–0.5%; and balance of Mg). This base article was washed and degreased with an organic solvent.

This earring base article was immersed in a plating solution having the composition below. A copper plating layer was formed in a thickness of 8 μm on the base article surface by electroplating under the plating conditions below. The plated article was washed with water.

<<Copper Plating>>
<Plating Solution Composition>

| Copper pyrophosphate | 100 g/lit. |
|---|---|
| Potassium pyrophosphate | 340 g/lit. |
| Ammonium citrate | 10 g/lit. |
| Ammonia | 3 g/lit. |

<Plating Conditions>

| pH | 8.5 |
|---|---|
| Bath temperature | 50° C. |
| Current density (Dk) | 3 A/dm$^2$ |

This base article having the copper plating layer was immersed in a plating solution having the composition below. A copper-tin-palladium alloy plating layer was formed in a thickness of 2 μm on the base article surface by electroplating under the plating conditions below. The plated base article was washed with water.

<<Copper-Tin-Palladium Alloy Plating>>
<Plating Solution Composition>

| Sodium stannate trihydrate (Na$_2$SnO$_3$ · 3H$_2$O) | 60 g/L (26.7 g/lit. in terms of Sn) |
|---|---|
| Copper cyanide (CuCN) | 20 g/L (14.2 g/lit. in terms of Cu) |
| Palladium potassium cyanide hydrate (K$_2$Pd(CN)$_4$ · 3H$_2$O) | 30 g/lit. (9.3 g/lit. in terms of Pd) |
| Amidosulfonic acid (NH$_2$SO$_3$H) | 10 g/L |
| Potassium cyanide (free) | 30 g/lit. |
| Potassium hydroxide | 60 g/lit. |

<Plating Conditions>

| pH | 12.5–13 |
|---|---|
| Solution temperature | 50–55° C. |
| Current density (Dk) | 2 A/dm$^2$ |
| Layer forming rate | 0.33 μm/minute |

This base article was set in an ion plating apparatus, and the surface of the base article was cleaned by bombard cleaning in an argon atmosphere.

On the surface of the copper-tin-palladium alloy plating layer formed on the base article surface, a stainless steel coating layer of a white color tone was formed in a thickness of 1.2 μm by an ion plating process under the layer formation conditions below to obtain an earring.

<Layer Formation Conditions>
Evaporation source:
Nickel-free ferritic stainless steel SUS444

| Gas: | Argon gas |
|---|---|
| Layer formation pressure: | 0.15–0.65 Pa |
| Anode voltage: | 40–50 V |
| Bias voltage: | Ground to −200 V |
| Filament current: | 50 A |
| E/B: | 10 kV, 0.2–0.3 mA |

The resulting earring was tested for the corrosion resistance of the plating layer according to the aforementioned method. The rating number was not lower than 9.8, showing that the corrosion resistance was "good".

Example 8

A base article of a necklace was shaped from brass by machining. This base article was washed and degreased with an organic solvent.

This base article was immersed in a plating solution having the composition below. A nickel strike plating layer (flash plating) was formed in a thickness of 0.1–0.2 μm on the base article surface by electroplating under the plating conditions below. The plated article was washed with water.

<<Nickel Strike Plating>>
<Plating Solution Composition>

| Nickel chloride | 180 g/lit. |
|---|---|
| Hydrochloric acid | 100 g/lit. |

<Plating Conditions>

| pH | 1< (specifically 0.3 to less than 1) |
|---|---|
| Solution temperature | Room temperature |
| Current density (Dk) | 3–5 A/dm$^2$ |
| Time | 30–60 seconds |

This necklace article having a nickel strike plating layer was immersed in a plating solution having the composition below. A nickel plating layer was formed in a thickness of 4 μm on the nickel strike plating layer surface by electroplating under the plating conditions below. The plated base article was washed with water.

<<Nickel Plating>>
<Plating Solution Composition>

| | |
|---|---|
| Nickel sulfate | 250 g/lit. |
| Nickel chloride | 75 g/lit. |
| Boric acid | 50 g/lit. |
| Brightener (Brightener #61, produced by Ebara-Udylite Co., Ltd.) | 0.5 ml/lit. |

<Plating Conditions>

| | |
|---|---|
| pH | 3.6–4.0 |
| Solution temperature | 40–50° C. |
| Current density (Dk) | 3 A/dm$^2$ |

This plated base article was set in a sputtering apparatus, and the surface of the base article was cleaned by bombard cleaning in an argon atmosphere.

On the surface of the nickel plating layer formed on this base article surface, a white-colored stainless steel coating layer was formed in a thickness of 1.0 μm by a sputtering method under the layer formation conditions below.
<Layer Formation Conditions>

| | |
|---|---|
| Target: | Austenitic stainless steel SUS304 |
| Sputtering gas: | Argon gas |
| Layer formation pressure: | 0.2–0.9 Pa |
| Target power: | 1.0–2.0 kW |
| Bias voltage: | Ground to −300 V |

On a prescribed portion of the surface of the stainless steel coating layer formed on the necklace base article surface, an organic masking agent composed of an epoxy type resin was applied to form a masking layer.

The necklace base article having the masking layer formed thereon was washed with isopropyl alcohol, and was set in a sputtering apparatus. A titanium nitride coating layer was formed in a thickness of 0.2 μm on the surface of the stainless steel coating layer and on the surface of the masking layer by sputtering under the layer formation conditions below.
<Layer Formation Conditions>

| | |
|---|---|
| Target: | Titanium (Ti) |
| Sputtering gas: | Nitrogen gas |
| Layer formation pressure: | 0.2–0.9 Pa |
| Target power: | 1.0–2.0 kW |
| Bias voltage: | Ground to −300 V |

The masking layer was swelled by immersion in a peeling solution composed of ethyl methyl ketone (EMK) containing formic acid and hydrogen peroxide. The masking layer with the titanium nitride coating layer was peeled off to obtain a necklace having an outermost coating layer (finished plating layer) of two-color tone of a white-colored stainless steel coating layer and a gold-colored titanium nitride coating layer.

The resulting necklace was tested for the corrosion resistance of the plating layer according to the aforementioned method. The rating number was not lower than 9.8, showing that the corrosion resistance was "good".

Example 9

A base article of a watchband was shaped from brass by machining. This base article was washed and degreased with an organic solvent.

This base article was immersed in a plating solution having the composition below. A nickel strike plating layer (flash plating) was formed in a thickness of 0.1–0.2 μm on the base article surface by electroplating under the plating conditions below. The plated article was washed with water.
<<Nickel Strike Plating>>
<Plating Solution Composition>

| | |
|---|---|
| Nickel chloride | 180 g/lit. |
| Hydrochloric acid | 100 g/lit. |
| Brightener (Brightener #61, produced by Ebara-Udylite Co., Ltd.) | 0.5 ml/lit. |

<Plating Conditions>

| | |
|---|---|
| pH | <1 (specifically, 0.3 to less than 1) |
| Solution temperature | Room temperature |
| Current density (Dk) | 3–5 A/dm$^2$ |
| Time | 30–60 seconds |

This watchband base article having a nickel strike plating layer was immersed in a plating solution having the composition below. A nickel plating layer was formed in a thickness of 2 μm on the nickel strike plating layer surface by electroplating under the plating conditions below. The plated base article was washed with water.
<<Nickel Plating>>
<Plating Solution Composition>

| | |
|---|---|
| Nickel sulfate | 250 g/lit. |
| Nickel chloride | 75 g/lit. |
| Boric acid | 50 g/lit. |
| Brightener (Brightener #61, produced by Ebara-Udylite Co., Ltd.) | 0.5 ml/lit. |

<Plating Conditions>

| | |
|---|---|
| pH | 3.6–4.0 |
| Solution temperature | 40–50° C. |
| Current density (Dk) | 3 A/dm$^2$ |

This watchband base article having a nickel plating layer was immersed in a plating solution having the composition below. A nickel-phosphorus alloy plating layer was formed in a thickness of 2 μm on the nickel plating layer surface by electroplating under the plating conditions below. The plated base article was washed with water.
<<Nickel-Phosphorus Alloy Plating>>
<Plating Solution Composition>

| | |
|---|---|
| Nickel sulfate | 40–50 g/lit. |
| Nickel hydroxide | 10–20 g/lit. |
| Sodium hypophosphite | 3–10 g/lit. |

-continued

| | |
|---|---|
| Phosphoric acid | 10–20 ml/lit. |
| Sodium citrate | 30–50 g/lit. |

<Plating Conditions>

| | |
|---|---|
| pH | 2.6–3.2 |
| Solution temperature | 55° C. |
| Current density (Dk) | 2 A/dm$^2$ |

This watchband base article having a nickel-phosphorus alloy plating layer was immersed in a plating solution having the composition below. A palladium-nickel alloy plating layer (flash plating) was formed in a thickness of 0.1–0.2 μm on the nickel-phosphorus plating layer surface by electroplating under the plating conditions below. The plated base article was washed with water, and dried.
<<Palladium-Nickel Alloy Plating>>
<Plating Solution Composition>

| | |
|---|---|
| Palladium | 7.5 g/lit. |
| Nickel | 12.5 g/lit. |

<Plating Conditions>

| | |
|---|---|
| pH | 8 |
| Solution temperature | 32° C. |
| Current density (Dk) | 1.0 A/dm$^2$ |
| Specific gravity (Be) | 12.5 |
| Layer forming rate | 4.2 minutes/1 μm |

This plated base article was set in a sputtering apparatus, and the surface of the base article was cleaned by bombard cleaning in an argon atmosphere.

On the surface of the palladium-nickel alloy plating layer formed on this base article surface, a titanium plating layer was formed in a thickness of 0.2–0.5 μm by a sputtering method under the layer formation conditions below.
<Layer Formation Conditions>

| | |
|---|---|
| Target: | Titanium |
| Sputtering gas: | Argon gas |
| Layer formation pressure: | 0.2–0.9 Pa |
| Target power: | 1.0–2.0 kW |
| Bias voltage: | Ground to –300 V |

On the surface of the titanium plating layer formed on this base article surface, a titanium carbide plating layer was formed in a thickness of 0.4 μm by a sputtering method under the layer formation conditions below.
<Layer Formation Conditions>

| | |
|---|---|
| Target: | Titanium |
| Sputtering gas: | Gas mixture of $C_2H_4$, $CH_4$ and $C_6H_6$ |
| Layer formation pressure: | 0.2–0.9 Pa |
| Target power: | 1.0–2.0 kW |
| Bias voltage: | Ground to –300 V |

On the surface of the titanium carbide plating layer formed on this base article surface, a white-colored stainless steel coating layer was formed in a thickness of 0.3 μm by a sputtering method under the layer formation conditions below to obtain a watchband.
<Layer Formation Conditions>

| | |
|---|---|
| Target: | Austenitic stainless steel SUS304 |
| Sputtering gas: | Argon gas |
| Layer formation pressure: | 0.2–0.9 Pa |
| Target power: | 1.0–2.0 kW |
| Bias voltage: | Ground to –300 V |

The resulting watchband was tested for the corrosion resistance of the plating layer according to the aforementioned method. The rating numbers were not lower than 9.8, showing that the corrosion resistance was "good".

Example 10

A watchband having a titanium plating layer, a titanium carbide plating layer, and a white-colored stainless steel coating layer of 0.3 μm thick was produced in the same manner as in Example 9 except that the titanium plating layer, the titanium carbide plating layer, and the stainless steel coating layer were formed by an arc evaporation method instead of the sputtering method. The layer formation conditions of the arc evaporation method were shown below.
<Titanium Plating Layer Formation Conditions>

| | |
|---|---|
| Target: | Titanium |
| Gas: | Argon gas |
| Layer formation pressure: | 1.0–3.0 Pa |
| Target current: | 80–100 A |
| Bias voltage: | –50 to –200 V |

<Titanium Carbide Plating Layer Formation Conditions>

| | |
|---|---|
| Target: | Titanium |
| Gas: | Gas mixture of $CH_4$, $C_2H_4$ and $C_6H_6$ |
| Layer formation pressure: | 1.0–3.0 Pa |
| Target current: | 80–100 A |
| Bias voltage: | –50 to –200 V |

<Stainless Steel Coating Layer Formation Conditions>

| | |
|---|---|
| Target: | Austenitic stainless steel SUS304 |
| Gas: | Argon gas |
| Layer formation pressure: | 1.0–3.0 Pa |
| Target current: | 80–100 A |
| Bias voltage: | –50 to –200 V |

The resulting watchband was tested for the corrosion resistance of the plating layer according to the aforementioned method. The rating numbers were not lower than 9.8, showing that the corrosion resistance was "good".

Example 11

A watchband having a titanium plating layer, a titanium carbide plating layer and a white-colored stainless steel coating layer of 0.3 μm thick was produced in the same manner as in Example 9 except that the titanium plating layer, the titanium carbide plating layer, and the stainless steel coating layer were formed by an ion plating method instead of the sputtering method. The layer formation conditions of the ion plating method were shown below.

<Titanium Plating Layer Formation Conditions>

| | |
|---|---|
| Evaporation source: | Titanium |
| Gas: | Argon gas |
| Layer formation pressure: | 0.15–0.65 Pa |
| Anode voltage: | 40–50 V |
| Bias voltage: | Ground to −200 V |
| Filament current: | 50 A |
| E/B: | 10 kV, 0.25–0.35 mA |

<Titanium Carbide Plating Layer Formation Conditions>

| | |
|---|---|
| Evaporation source: | Titanium |
| Gas: | Gas mixture of $CH_4$, $C_2H_4$ and $C_6H_6$ |
| Layer formation pressure: | 0.15–0.65 Pa |
| Anode voltage: | 40–50 V |
| Bias voltage: | Ground to −200 V |
| Filament current: | 50 A |
| E/B: | 10 kV, 0.25–0.35 mA |

<Stainless Steel Coating Layer Formation Conditions>

| | |
|---|---|
| Evaporation source: | Austenitic stainless steel SUS304 |
| Gas: | Argon gas |
| Layer formation pressure: | 0.15–0.65 Pa |
| Anode voltage: | 40–50 V |
| Bias voltage: | Ground to −200 V |
| Filament current: | 50 A |
| E/B: | 10 kV, 0.2–0.3 mA |

The resulting watchband was tested for the corrosion resistance of the plating layer according to the aforementioned method. The rating numbers were not lower than 9.8, showing that the corrosion resistance was "good".

Example 12

A base article of a watchcase was shaped from brass by machining. This base article was washed and degreased with an organic solvent.

This base article was immersed in a plating solution having the composition below. A nickel strike plating layer (flash plating) was formed in a thickness of 0.1–0.2 μm on the base article surface by electroplating under the plating conditions below. The plated article was washed with water.

<<Nickel Strike Plating>>
<Plating Solution Composition>

| | |
|---|---|
| Nickel chloride | 180 g/lit. |
| Hydrochloric acid | 100 g/lit. |

<Plating Conditions>

| | |
|---|---|
| pH | <1 (specifically, 0.3 to less than 1) |
| Solution temperature | Room temperature |
| Current density (Dk) | 3–5 $A/dm^2$ |
| Time | 30–60 seconds |

This watchcase base article having a nickel strike plating layer was immersed in a plating solution having the composition below. A nickel plating layer was formed in a thickness of 2 μm on the nickel strike plating layer surface by electroplating under the plating conditions below. The plated base article was washed with water.

<<Nickel Plating>>
<Plating Solution Composition>

| | |
|---|---|
| Nickel sulfate | 250 g/lit. |
| Nickel chloride | 75 g/lit. |
| Boric acid | 50 g/lit. |
| Brightener (Brightener #61, produced by Ebara-Udylite Co., Ltd.) | 0.5 ml/lit. |

<Plating Conditions>

| | |
|---|---|
| pH | 3.6–4.0 |
| Solution temperature | 40–50° C. |
| Current density (Dk) | 3 $A/dm^2$ |

This watchcase base article having a nickel plating layer was immersed in a plating solution having the composition below. A nickel-phosphorus alloy plating layer was formed in a thickness of 2 μm on the nickel plating layer surface by electroplating under the plating conditions below. The plated base article was washed with water.

<<Nickel-Phosphorus Alloy Plating>>
<Plating Solution Composition>

| | |
|---|---|
| Nickel sulfate | 40–50 g/lit. |
| Nickel hydroxide | 10–20 g/lit. |
| Sodium hypophosphite | 3–10 g/lit. |
| Phosphoric acid | 10–40 ml/lit. |
| Sodium citrate | 30–50 g/lit. |

<Plating Conditions>

| | |
|---|---|
| pH | 2.6–3.2 |
| Solution temperature | 55° C. |
| Current density (Dk) | 2 $A/dm^2$ |

This watchcase base article having a nickel-phosphorus alloy plating layer was immersed in a plating solution having the composition below. A palladium-nickel alloy plating layer (flash plating) was formed in a thickness of 0.1–0.2 μm on the nickel-phosphorus alloy plating layer surface by electroplating under the plating conditions below. The plated base article was washed with water, and dried.

<<Palladium-Nickel Alloy Plating>>
<Plating Solution Composition>

| | |
|---|---|
| Palladium | 7.5 g/lit. |
| Nickel | 12.5 g/lit. |

<Plating Conditions>

| | |
|---|---|
| pH | 8 |
| Solution temperature | 32° C. |

-continued

| | |
|---|---|
| Current density (Dk) | 1.0 A/dm² |
| Specific gravity (Be) | 12.5 |
| Layer forming rate | 4.2 minutes/1 μm |

This plated base article was set in a sputtering apparatus, and the surface of the base article was cleaned by bombard cleaning in an argon atmosphere.

On the surface of the palladium-nickel alloy plating layer formed on this base article surface, a titanium plating layer was formed in a thickness of 0.2–0.5 μm by a sputtering method under the layer formation conditions below.

<Layer Formation Conditions>

| | |
|---|---|
| Target: | Titanium |
| Sputtering gas: | Argon gas |
| Layer formation pressure: | 0.2–0.9 Pa |
| Target power: | 1.0–2.0 kW |
| Bias voltage: | Ground to −300 V |

On the surface of the titanium plating layer formed on this base article surface, a white-colored stainless steel coating layer was formed in a thickness of 0.3 μm by a sputtering method under the layer formation conditions below to obtain a watchcase.

<Layer Formation Conditions>

| | |
|---|---|
| Target: | Austenitic stainless steel SUS304 |
| Sputtering gas: | Argon gas |
| Layer formation pressure: | 0.2–0.9 Pa |
| Target power: | 1.0–2.0 kW |
| Bias voltage: | Ground to −300 V |

The resulting watchcase was tested for the corrosion resistance of the plating layer according to the aforementioned method. The rating numbers were not lower than 9.8, showing that the corrosion resistance was "good".

Example 13

A watchcase having a titanium plating layer and a white-colored stainless steel coating layer of 0.3 μm thick was produced in the same manner as in Example 12 except that the titanium plating layer and the stainless steel coating layer were formed by an arc evaporation method instead of the sputtering method. The layer formation conditions of the arc evaporation method were shown below.

<Titanium Plating Layer Formation Conditions>

| | |
|---|---|
| Target: | Titanium |
| Gas: | Argon gas |
| Layer formation pressure: | 1.0–3.0 Pa |
| Target current: | 80–100 A |
| Bias voltage: | −50 to −200 V |

<Stainless Steel Coating Layer Formation Conditions>

| | |
|---|---|
| Target: | Austenitic stainless steel SUS304 |
| Gas: | Argon gas |
| Layer formation pressure: | 1.0–3.0 Pa |

-continued

| | |
|---|---|
| Target current: | 80–100 A |
| Bias voltage: | −50 to −200 V |

The resulting watchcase was tested for the corrosion resistance of the plating layer according to the aforementioned method. The rating numbers were not lower than 9.8, showing that the corrosion resistance was "good".

Example 14

A watchcase having a titanium plating layer, and a white-colored stainless steel coating layer of 0.3 μm thick was produced in the same manner as in Example 12 except that the titanium plating layer and the stainless steel coating layer were formed by an ion plating process instead of the sputtering method. The layer formation conditions of the ion plating method were shown below.

<Titanium Plating Layer Formation Conditions>

| | |
|---|---|
| Evaporation source: | Titanium |
| Gas: | Argon gas |
| Layer formation pressure: | 0.15–0.65 Pa |
| Anode voltage: | 40–60 V |
| Bias voltage: | Ground to −200 V |
| Filament current | 50 A |
| E/B: | 10 kV, 0.25–0.35 mA |

<Stainless Steel Coating Layer Formation Conditions>

| | |
|---|---|
| Evaporation source: | Austenitic stainless steel SUS304 |
| Gas: | Argon gas |
| Layer formation pressure: | 0.15–0.65 Pa |
| Anode voltage: | 40–50 V |
| Bias voltage: | Ground to −200 V |
| Filament current | 50 A |
| E/B: | 10 kV, 0.2–0.3 mA |

The resulting watchcase was tested for the corrosion resistance of the plating layer according to the aforementioned method. The rating numbers were not lower than 9.8, showing that the corrosion resistance was "good".

Example 15

A base article of a watchband was shaped from zinc by machining. This base article was washed and degreased with an organic solvent.

This watchband base article was immersed in a plating solution having the composition below. A copper-tin alloy plating layer was formed in a thickness of 2 μm on the surface of the base article by electroplating under the plating conditions below. The plated article was washed with water.

<<Copper-Tin Alloy Plating>>

<Plating Solution Composition>

| | |
|---|---|
| Copper | 15 g/lit. |
| Tin | 15 g/lit. |
| Zinc | 1 g/lit. |
| Potassium cyanide (free) | 30 ± 2 g/lit. |

<Plating Conditions>

| pH | 12.7 |
|---|---|
| Solution temperature | 50° C. |
| Current density (Dk) | 2 A/dm² |
| Layer forming rate | 3 minutes/1 μm |

This watchband base article having the copper-tin alloy plating layer was immersed in a plating solution having the composition below. A copper-tin-palladium alloy plating layer was formed in a thickness of 2 μm on the copper-tin alloy plating layer surface by electroplating under the plating conditions below. The plated base article was washed with water.
<<Copper-Tin-Palladium Alloy Plating>>
<Plating Solution Composition>

| Sodium stannate trihydrate (Na₂SnO₃.3H₂O) | 60 g/lit. (26.7 g/lit. in terms of Sn) |
|---|---|
| Copper cyanide | 20 g/lit. (14.2 g/lit. in terms of Cu) |
| Palladium potassium cyanide hydrate (K₂Pd (CN)₄.3H₂O) | 30 g/lit. (9.3 g/lit. in terms of Pd) |
| Amidosulfonic acid (NH₂SO₂H) | 10 g/lit. |
| Potassium cyanide (free) | 30 g/lit. |
| Potassium hydroxide | 60 g/lit. |

<Plating Conditions>

| pH | 12.5–13 |
|---|---|
| Solution temperature | 50–55° C. |
| Current density (Dk) | 2 A/dm² |
| Layer forming rate | 0.33 μm/minute |

This watchband base article having the copper-tin-palladium alloy plating layer was immersed in a plating solution having the composition below. A palladium strike plating layer (flash plating) was formed in a thickness of 0.2 μm on the copper-tin-palladium alloy plating layer surface by electroplating under the plating conditions below. The plated base article was washed with water.
<<Palladium Strike Plating>>
<Plating Solution Composition>

| Pure palladium | 1–3 g/lit. |
|---|---|

<Plating Conditions>

| pH | 8 |
|---|---|
| Solution temperature | 32° C. |
| Current density (Dk) | 3–5 A/dm² |
| Time | 30 seconds |

This plated base article was set in a sputtering apparatus, and the surface of the base article was cleaned by bombard cleaning in an argon atmosphere.

On the surface of the palladium strike plating layer formed on this base article, a titanium plating layer was formed in a thickness of 0.2–0.5 μm by a sputtering method under the layer formation conditions below.

<Layer Formation Conditions>

| Target: | Titanium |
|---|---|
| Sputtering gas: | Argon gas |
| Layer formation pressure: | 0.2–0.9 Pa |
| Target power: | 1.0–2.0 kW |
| Bias voltage: | Ground to −300 V |

On the surface of the titanium plating layer formed on this base article surface, a titanium carbide plating layer was formed in a thickness of 0.4 μm by a sputtering method under the layer formation conditions below.

<Layer Formation Conditions>

| Target: | Titanium |
|---|---|
| Sputtering gas: | Gas mixture of C₂H₄, CH₄ and C₆H₆ |
| Layer formation pressure: | 0.2–0.9 Pa |
| Target power: | 1.0–2.0 kW |
| Bias voltage: | Ground to −300 V |

On the surface of the titanium carbide plating layer formed on this base article, a white-colored stainless steel coating layer was formed in a thickness of 0.5 μm by a sputtering method under the layer formation conditions below to obtain a watchband.

<Layer Formation Conditions>

| Target: | Nickel-free ferritic stainless steel SUS444 |
|---|---|
| Sputtering gas: | Argon gas |
| Layer formation pressure: | 0.2–0.9 Pa |
| Target power: | 1.0–2.0 kW |
| Bias voltage: | Ground to −300 V |

The resulting watchband was tested for the corrosion resistance of the plating layer according to the aforementioned method. The rating number was not lower than 9.8, showing that the corrosion resistance was "good".

Example 16

A watchband having a titanium plating layer, a titanium carbide plating layer, and a white-colored stainless steel coating layer of 0.5 μm thick was produced in the same manner as in Example 15 except that the titanium plating layer, the titanium carbide plating layer, and the stainless steel coating layer were formed by an arc evaporation method instead of the sputtering method. The layer formation conditions of the arc evaporation method were shown below.

<Titanium Plating Layer Formation Conditions>

| Target: | Titanium |
|---|---|
| Gas: | Argon gas |
| Layer formation pressure: | 1.0–3.0 Pa |
| Target current: | 80–100 A |
| Bias voltage: | −50 to −200 V |

<Titanium Carbide Plating Layer Formation Conditions>

| Target: | Titanium |
|---|---|
| Gas: | Gas mixture of $C_2H_4$, $CH_4$ and $C_6H_6$ |
| Layer formation pressure: | 1.0–3.0 Pa |
| Target current: | 80–100 A |
| Bias voltage: | −50 to −200 V |

<Stainless Steel Coating Layer Formation Conditions>

| Target: | Nickel-free ferritic stainless steel SUS444 |
|---|---|
| Gas: | Argon gas |
| Layer formation pressure: | 1.0–3.0 Pa |
| Target current: | 80–100 A |
| Bias voltage: | −50 to −200 V |

The resulting watchband was tested for the corrosion resistance of the plating layer according to the aforementioned method. The rating numbers were not lower than 9.8, showing that the corrosion resistance was "good".

Example 17

A watchband having a titanium plating layer, a titanium carbide plating layer and a white-colored stainless steel coating layer of 0.5 μm thick was produced in the same manner as in Example 15 except that the titanium plating layer, the titanium carbide plating layer and the stainless steel coating layer were formed by an ion plating method instead of the sputtering method. The layer formation conditions of the ion plating method were as shown below.

<Titanium Plating Layer Formation Conditions>

| Evaporation source: | Titanium |
|---|---|
| Gas: | Argon gas |
| Layer formation pressure: | 0.15–0.65 Pa |
| Anode voltage: | 40–60 V |
| Bias voltage: | Ground to −200 V |
| Filament current | 50 A |
| E/B: | 10 kV, 0.25–0.35 mA |

<Titanium Carbide Plating Layer Formation Conditions>

| Evaporation source: | Titanium |
|---|---|
| Gas: | Gas mixture of $C_2H_4$, $CH_4$, and $C_6H_6$ |
| Layer formation pressure: | 0.15–0.65 Pa |
| Anode voltage: | 40–60 V |
| Bias voltage: | Ground to −200 V |
| Filament current | 50 A |
| E/B: | 10 kV, 0.25–0.35 mA |

<Stainless Steel Coating Layer Formation Conditions>

| Evaporation source: | Nickel-free ferritic stainless steel SUS444 |
|---|---|
| Gas: | Argon gas |
| Layer formation pressure: | 0.15–0.65 Pa |
| Anode voltage: | 40–50 V |
| Bias voltage: | Ground to −200 V |
| Filament current | 50 A |
| E/B: | 10 kV, 0.2–0.3 mA |

The resulting watchband was tested for the corrosion resistance of the plating layer according to the aforementioned method. The rating numbers were not lower than 9.8, showing that the corrosion resistance was "good".

Example 18

A base article of a watchcase was shaped from zinc by machining. This base article was washed and degreased with an organic solvent.

This watchcase base article was immersed in a plating solution having the composition below. A copper-tin alloy plating layer was formed in a thickness of 2 μm on the base article surface by electroplating under the plating conditions below. The plated article was washed with water.

<<Copper-Tin Alloy Plating>>
<Plating Solution Composition>

| Copper | 15 g/lit. |
|---|---|
| Tin | 15 g/lit. |
| Zinc | 1 g/lit. |
| Potassium cyanide (free) | 30 ± 2 g/lit. |

<Plating Conditions>

| pH. | 12.7 |
|---|---|
| Solution temperature | 50° C. |
| Current density (Dk) | 2 A/dm$^2$ |
| Layer forming rate | 3 minutes/1 μm |

This watchcase base article having the copper-tin alloy plating layer was immersed in a plating solution having the composition below. A copper-tin-palladium alloy plating layer was formed in a thickness of 2 μm on the copper-tin alloy plating layer surface by electroplating under the plating conditions below. The plated base article was washed with water.

<<Copper-Tin-Palladium Alloy Plating>>
<Plating Solution Composition>

|سodium stannate trihydrate ($Na_2SnO_3 \cdot 3H_2O$) | 60 g/lit. (26.7 g/L in terms of Sn) |
|---|---|
| Copper cyanide | 20 g/lit. (14.2 g/lit. in terms of Cu) |
| Palladium potassium cyanide hydrate ($K_2Pd(CN)_4 \cdot 3H_2O$) | 30 g/lit. (9.3 g/lit. in terms of Pd) |
| Amidosulfonic acid ($NH_2SO_2H$) | 10 g/lit. |
| Potassium cyanide (free) | 30 g/lit. |
| Potassium hydroxide | 60 g/lit. |

<Plating Conditions>

| | |
|---|---|
| pH | 12.5–13 |
| Solution temperature | 50–55° C. |
| Current density (Dk) | 2 A/dm² |
| Layer forming rate | 0.33 μm/minute |

This watchcase base article having the copper-tin-palladium alloy plating layer was immersed in a plating solution having the composition below. A gold strike plating layer (flash plating) was formed in a thickness of 0.1–0.2 μm on the copper-tin-palladium alloy plating layer surface by electroplating under the plating conditions below. The plated base article was washed with water.
<<Gold Strike Plating>>
<Plating Solution Composition>

| | |
|---|---|
| Gold | 3–5 g/lit. |
| Sulfuric acid | 10 g/lit. |

<Plating Conditions>

| | |
|---|---|
| pH | <1 (specifically, 0.3 to less than 1.0) |
| Solution temperature | 20–35° C. |
| Current density (Dk) | 3–5 A/dm² |
| Time | 30 seconds |

This plated base article was set in a sputtering apparatus, and the surface of the base article was cleaned by bombard cleaning in an argon atmosphere.

On the surface of the gold strike plating layer formed on this base article surface, a titanium plating layer was formed in a thickness of 0.2–0.5 μm by a sputtering method under the layer formation conditions below.
<Layer Formation Conditions>

| | |
|---|---|
| Target: | Titanium |
| Sputtering gas: | Argon gas |
| Layer formation pressure: | 0.2–0.9 Pa |
| Target power: | 1.0–2.0 kW |
| Bias voltage: | Ground to –300 V |

On the surface of the titanium plating layer formed on this base article surface, a white-colored stainless steel coating layer was formed in a thickness of 0.3 μm by a sputtering method under the layer formation conditions below to obtain a watchcase.
<Layer Formation Conditions>

| | |
|---|---|
| Target: | Nickel-free ferritic stainless steel SUS444 |
| Sputtering gas: | Argon gas |
| Layer formation pressure: | 0.2–0.9 Pa |
| Target power: | 1.0–2.0 kW |
| Bias voltage: | Ground to –300 V |

The resulting watchcase was tested for the corrosion resistance of the plating layer according to the aforementioned method. The rating number was not lower than 9.8, showing that the corrosion resistance was "good".

Example 19

A watchcase having a titanium plating layer and a white-colored stainless steel coating layer of 0.3 μm thick was produced in the same manner as in Example 18 except that the titanium plating layer and the stainless steel coating layer were formed by an arc evaporation method instead of the sputtering method. The layer formation conditions of the arc evaporation method were shown below.
<Titanium Coating Layer Formation Conditions>

| | |
|---|---|
| Target: | Titanium |
| Gas: | Argon gas |
| Layer formation pressure: | 1.0–3.0 Pa |
| Target current: | 80–100 A |
| Bias voltage: | –50 to –200 V |

<Stainless Steel Coating Layer Formation Conditions>

| | |
|---|---|
| Target: | Nickel-free ferritic stainless steel SUS444 |
| Gas: | Argon gas |
| Layer formation pressure: | 1.0–3.0 Pa |
| Target current: | 80–100 A |
| Bias voltage: | –50 to –200 V |

The resulting watchcase was tested for the corrosion resistance of the plating layer according to the aforementioned method. The rating numbers were not lower than 9.8, showing that the corrosion resistance was "good".

Example 20

A watchcase having a titanium plating layer, and a white-colored stainless steel coating layer of 0.3 μm thick was produced in the same manner as in Example 18 except that the titanium plating layer and the stainless steel coating layer of Example 18 were formed by an ion plating method instead of the sputtering method. The layer formation conditions of the ion plating method were shown below.
<Titanium Plating Layer Formation Conditions>

| | |
|---|---|
| Evaporation source: | Titanium |
| Gas: | Argon gas |
| Layer formation pressure: | 0.15–0.65 Pa |
| Anode voltage: | 40–60 V |
| Bias voltage: | Ground to –200 V |
| Filament current | 50 A |
| E/B: | 10 kV, 0.25–0.35 mA |

<Stainless Steel Coating Layer Formation Conditions>

| | |
|---|---|
| Evaporation source: | Nickel-free ferritic stainless steel SUS444 |
| Gas: | Argon gas |
| Layer formation pressure: | 0.15–0.65 Pa |
| Anode voltage: | 40–50 V |
| Bias voltage: | Ground to –200 V |
| Filament current | 50 A |
| E/B: | 10 kV, 0.2–0.3 mA |

The resulting watchcase was tested for the corrosion resistance of the plating layer according to the aforementioned method. The rating numbers were not lower than 9.8, showing that the corrosion resistance was "good".

Example 21

A base article of a watchband was shaped from brass by machining. This base article was washed and degreased with an organic solvent.

The base article was immersed in a plating solution having the composition below. A copper-tin alloy plating layer (alloy metal ratio: Cu, 75 wt %; Sn, 20 wt %; and Zn, 5 wt %) was formed in a thickness of 3 µm on the base article surface by electroplating under the plating conditions below. The plated article was washed with water. Incidentally, the copper-tin alloy plating layer generally includes those containing zinc in a small amount.

<<Copper-Tin Alloy Plating>>
<Plating Solution Composition>

| | |
|---|---|
| Copper cyanide | 15 g/lit. (in terms of Cu) |
| Sodium stannate | 15 g/lit. (in terms of Sn) |
| Zinc cyanide | 1 g/lit. (in terms of Zn) |
| KOH | 20 g/lit. |
| KCN (free) | 30 g/lit. |
| Brightener B (trade name) (produced by Nippon Shin-Kinzoku K. K.) | 10 ml/lit. |

<Plating Conditions>

| | |
|---|---|
| pH | 12.5 (at 50° C.) |
| Solution temperature | 50° C. |
| Current density (Dk) | 2.0 A/dm$^2$ |
| Electrolysis time | 12 minutes |
| Stirring of plating solution | Rotation of rack of cathode rocker type |

This watchband base article having the copper-tin alloy plating layer was immersed in a plating solution having the composition below. A copper-tin-zinc alloy plating layer (alloy metal ratio: Cu, 50 wt %; Sn, 35 wt %; and Zn, 15 wt %) was formed in a thickness of 2.5 µm on the copper-tin alloy plating layer surface by electroplating under the plating conditions below. The plated base article was washed with water.

<<Copper-Tin-Zinc Alloy Plating>>
<Plating Solution Composition>

| | |
|---|---|
| Copper cyanide | 8.5 g/lit. (in terms of Cu) |
| Sodium stannate | 34.0 g/lit. (in terms of Sn) |
| Zinc cyanide | 1.0 g/lit. (in terms of Zn) |
| KOH | 20 g/lit. |
| KCN (free) | 50 g/lit. |
| Brightener 1 - 1 (trade name) (produced by Degussa Japan Co., Ltd.) | 0.5 ml/lit. |
| Brightener 2 (trade name) (produced by Degussa Japan Co., Ltd.) | 0.5 ml/lit. |

<Plating Conditions>

| | |
|---|---|
| pH | 13.0 (at 60° C.) |
| Solution temperature | 60.0° C. |
| Current density (Dk) | 2.0 A/dm$^2$ |
| Electrolysis time | 15 minutes |

This watchband base article having the copper-tin-zinc alloy plating layer was immersed in a plating solution having the composition below. A gold strike plating layer (flash plating) was formed in a thickness of 0.1–0.2 µm on the copper-tin-zinc alloy plating layer surface by electroplating under the plating conditions below. The plated base article was washed with water.

<<Gold Strike Plating>>
<Plating Solution Composition>

| | |
|---|---|
| Auric potassium cyanide (KAu(CN)$_4$) | 2.0 g/lit. (in terms of Au) |
| Sulfuric acid (aqueous 10% solution) | 10 g/lit. |

<Plating Conditions>

| | |
|---|---|
| pH | 0.3 to 1 |
| Solution temperature | Room temperature |
| Current density (DK) | 3 A/dm$^2$ |
| Electrolysis time | 15 seconds |

This plated base article was set in a sputtering apparatus, and the surface of the base article was cleaned by bombard cleaning in an argon atmosphere.

On the surface of the gold strike plating layer formed on this base article surface, a white-colored stainless steel coating layer was formed in a thickness of 0.5 µm by a sputtering method under the layer formation conditions below to obtain a watchband.

<Layer Formation Conditions>

| | |
|---|---|
| Target: | Austenitic stainless steel SUS310S |
| Sputtering gas: | Argon gas |
| Layer formation pressure: | 0.2–0.9 Pa |
| Target power: | 1.0–2.0 kW |
| Bias voltage: | Ground to –300 V |

The resulting watchband was tested for the corrosion resistance of the plating layer according to the aforementioned method. The rating number was not lower than 9.8, showing that the corrosion resistance was "good".

Example 22

A base article of a watchband was shaped from zinc by machining. This base article was washed and degreased with an organic solvent.

This base article was immersed in a plating solution having the composition below. A copper plating layer was formed in a thickness of 8 µm on the base article surface by electroplating under the plating conditions below. The plated article was washed with water.

<<Copper Plating>>
<Plating Solution Composition>

| | |
|---|---|
| Copper pyrophosphate | 100 g/lit. |
| Potassium pyrophosphate | 340 g/lit. |
| Ammonium citrate | 10 g/lit. |
| Ammonia | 3 g/lit. |

<Plating Conditions>

| | |
|---|---|
| pH | 8.5 |
| Solution temperature | 50° C. |
| Current density (Dk) | 3 A/dm$^2$ |

This base article having a copper-plating layer was immersed in a plating solution having the composition below. A copper-tin alloy plating layer (alloy metal ratio: Cu, 75 wt %; Sn, 20 wt %; and Zn, 5 wt %) was formed in a thickness of 3 μm on the base article surface by electroplating under the plating conditions below. The plated article was washed with water.

<<Copper-Tin Alloy Plating>>

<Plating Solution Composition>

| | |
|---|---|
| Copper cyanide | 15 g/lit. (in terms of Cu) |
| Sodium stannate | 15 g/lit. (in terms of Sn) |
| Zinc cyanide | 1 g/lit. (in terms of Zn) |
| KOH | 20 g/lit. |
| KCN (free) | 30 g/lit. |
| Brightener B (trade name) (produced by Nippon Shin-Kinzoku K. K.) | 10 ml/lit. |

<Plating Conditions>

| | |
|---|---|
| pH | 12.5 (at 50° C.) |
| Solution temperature | 50° C. |
| Current density (Dk) | 2.0 A/dm$^2$ |
| Electrolysis time | 12 minutes |
| Stirring of plating solution | Rotation of rack of cathode rocker type |

This watchband base article having the copper-tin alloy plating layer was immersed in a plating solution having the composition below. A copper-tin-zinc alloy plating layer (alloy metal ratio: Cu, 50 wt %; Sn, 35 wt %; and Zn, 15 wt %) was formed in a thickness of 2.5 μm on the copper-tin alloy plating layer surface by electroplating under the plating conditions below. The plated base article was washed with water.

<<Copper-Tin-Zinc Alloy Plating>>

<Plating Solution Composition>

| | |
|---|---|
| Copper cyanide | 8.5 g/lit. (in terms of Cu) |
| Sodium stannate | 34.0 g/lit. (in terms of Sn) |
| Zinc cyanide | 1.0 g/lit. (in terms of Zn) |
| KOH | 20 g/lit. |
| KCN (free) | 50 g/lit. |
| Brightener 1 - 1 (trade name) (produced by Degussa Japan Co., Ltd.) | 0.5 ml/lit. |
| Brightener 2 (trade name) (produced by Degussa Japan Co., Ltd.) | 0.5 ml/lit. |

<Plating Conditions>

| | |
|---|---|
| pH | 13.0 (at 60° C.) |
| Solution temperature | 60.0° C. |
| Current density (Dk) | 2.0 A/dm$^2$ |
| Electrolysis time | 15 minutes |

This watchband base article having the copper-tin-zinc alloy plating layer was immersed in a plating solution having the composition below. A palladium strike plating layer (flash plating) was formed in a thickness of 0.2 μm on the copper-tin-zinc alloy plating layer surface by electroplating under the plating conditions below. The plated base article was washed with water.

<<Palladium Strike Plating>>

<Plating Solution Composition>

| | |
|---|---|
| Pure palladium | 1–3 g/lit. |

<Plating Conditions>

| | |
|---|---|
| pH | 8 |
| Solution temperature | 32° C. |
| Current density (Dk) | 3–5 A/dm$^2$ |
| Time | 30 seconds |

This plated base article was set in a sputtering apparatus, and the surface of the base article was cleaned by bombard cleaning in an argon atmosphere.

On the surface of the palladium strike plating layer formed on this base article, a white-colored stainless steel coating layer was formed in a thickness of 1.0 μm by a sputtering method under the layer formation conditions below to obtain a watchband.

<Layer Formation Conditions>

| | |
|---|---|
| Target: | Austenitic stainless steel SUS310S |
| Sputtering gas: | Argon gas |
| Layer formation pressure: | 0.2–0.9 Pa |
| Target power: | 1.0–2.0 kW |
| Bias voltage: | Ground to –300 V |

The resulting watchband was tested for the corrosion resistance of the plating layer according to the aforementioned method. The rating number was not lower than 9.8, showing that the corrosion resistance was "good".

Example 23

A base article of an earring was prepared by machining a magnesium alloy (composition: Al, 8.3–11.0%; Zn, 0.3–1.0%; Mn, 0.13–0.5%; and balance of Mg). This base article was washed and degreased with an organic solvent.

This earring base article was immersed in a plating solution having the composition below. A copper plating layer was formed in a thickness of 8 μm on the base article surface by electroplating under the plating conditions below. The plated article was washed with water.

<<Copper Plating>>

<Plating Solution Composition>

| | |
|---|---|
| Copper pyrophosphate | 100 g/lit. |
| Potassium pyrophosphate | 340 g/lit. |
| Ammonium citrate | 10 g/lit. |
| Ammonia | 3 g/lit. |

<Plating Conditions>

| | |
|---|---|
| pH | 8.5 |
| Solution temperature | 50° C. |
| Current density (Dk) | 3 A/dm$^2$ |

This base article having the copper plating layer was immersed in a plating solution having the composition below. A copper-tin-zinc alloy plating layer (alloy metal ratio: Cu, 50 wt %; Sn, 35 wt %; and Zn, 15 wt %) was formed in a thickness of 2.5 μm on the base article surface by electroplating under the plating conditions below. The plated base article was washed with water.

<<Copper-Tin-Zinc Alloy Plating>>
<Plating Solution Composition>

| | |
|---|---|
| Copper cyanide | 8.5 g/lit. (in terms of Cu) |
| Sodium stannate | 34.0 g/lit. (in terms of Sn) |
| Zinc cyanide | 1.0 g/lit. (in terms of Zn) |
| KOH | 20 g/lit. |
| KCN (free) | 50 g/lit. |
| Brightener 1 - 1 (trade name) | 0.5 ml/lit. |
| (produced by Degussa Japan Co., Ltd.) | |
| Brightener 2 (trade name) | 0.5 ml/lit. |
| (produced by Degussa Japan Co., Ltd.) | |

<Plating Conditions>

| | |
|---|---|
| pH | 13.0 (at 60° C.) |
| Solution temperature | 60.0° C. |
| Current density (Dk) | 2.0 A/dm$^2$ |
| Electrolysis time | 15 minutes |

This plated base article was set in an ion plating system, and the surface of the base article was cleaned by bombard cleaning in an argon atmosphere.

On the surface of the copper-tin-zinc alloy plating layer formed on this base article surface, a white-colored stainless steel coating layer was formed in a thickness of 1.2 μm by a sputtering method under the layer formation conditions below to obtain an earring.

<Layer Formation Conditions>

| | |
|---|---|
| Evaporation source: | Austenitic stainless steel SUS310S |
| Gas: | Argon gas |
| Layer formation pressure: | 0.2–0.9 Pa |
| Target power: | 1.0–2.0 kW |
| Bias voltage: | Ground to −300 V |

The resulting earring was tested for the corrosion resistance of the plating layer according to the aforementioned method. The rating number was not lower than 9.8, showing that the corrosion resistance was "good".

Example 24

A base article of a watchband was shaped from brass by machining. This base article was washed and degreased with an organic solvent.

The watchband base article was immersed in a plating solution having the composition below. A copper-tin alloy plating layer (alloy metal ratio: Cu, 75 wt %; Sn, 20 wt %; and Zn, 5 wt %) was formed in a thickness of 3 μm on the base article by electroplating under the plating conditions below. The plated article was washed with water.

<<Copper-Tin Alloy Plating>>
<Plating Solution Composition>

| | |
|---|---|
| Copper cyanide | 15 g/lit. (in terms of Cu) |
| Sodium stannate | 15 g/lit. (in terms of Sn) |
| Zinc cyanide | 1 g/lit. (in terms of Zn) |

-continued

| | |
|---|---|
| KOH | 20 g/lit. |
| KCN (free) | 30 g/lit. |
| Brightener B (trade name) | 10 ml/lit. |
| (produced by Nippon Shin-Kinzoku K. K.) | |

<Plating Conditions>

| | |
|---|---|
| pH | 12.5 (at 50° C.) |
| Solution temperature | 50° C. |
| Current density (Dk) | 2.0 A/dm$^2$ |
| Electrolysis time | 12 minutes |
| Stirring of plating solution | Rotation of rack of cathode rocker type |

This watchband base article having the copper-tin alloy plating layer was immersed in a plating solution having the composition below. A copper-tin-zinc alloy plating layer (alloy metal ratio: Cu, 50 wt %; Sn, 35 wt %, and Zn, 15 wt %) was formed in a thickness of 2.5 μm on the copper-tin alloy plating layer surface by electroplating under the plating conditions below. The plated base article was washed with water.

<<Copper-Tin-Zinc Alloy Plating>>
<Plating Solution Composition>

| | |
|---|---|
| Copper cyanide | 8.5 g/lit. (in terms of Cu) |
| Sodium stannate | 34.0 g/lit. (in terms of Sn) |
| Zinc cyanide | 1.0 g/lit. (in terms of Zn) |
| KOH | 20 g/lit. |
| KCN (free) | 50 g/lit. |
| Brightener 1—1 (trade name) | 0.5 ml/lit. |
| (produced by Degussa Japan Co., Ltd.) | |
| Brightener 2 (trade name) | 0.5 ml/lit. |
| (produced by Degussa Japan Co., Ltd.) | |

<Plating Conditions>

| | |
|---|---|
| pH | 13.0 (at 60° C.) |
| Solution temperature | 60.0° C. |
| Current density (Dk) | 2.0 A/dm$^2$ |
| Electrolysis time | 15 minutes |

This watchband base article having the copper-tin-zinc alloy plating layer was immersed in a plating solution having the composition below. A palladium strike plating layer (flash plating) was formed in a thickness of 0.2 μm on the copper-tin-zinc alloy plating layer surface by electroplating under the plating conditions below. The plated base article was washed with water.

<<Palladium Strike Plating>>

<Plating Solution Composition>

| | |
|---|---|
| Pure palladium | 1–3 g/lit. |

<Plating Conditions>

| | |
|---|---|
| pH | 8 |
| Solution temperature | 32° C. |
| Current density (Dk) | 3–5 A/dm² |
| Time | 30 seconds |

This plated base article was set in a sputtering apparatus, and the surface of the base article was cleaned by bombard cleaning in an argon atmosphere.

On the surface of the palladium strike plating layer formed on this base article surface, a titanium plating layer was formed in a thickness of 0.2–0.5 μm by a sputtering method under the layer formation conditions below.

<Layer Formation Conditions>

| | |
|---|---|
| Target: | Titanium |
| Sputtering gas: | Argon gas |
| Layer formation pressure: | 0.2–0.9 Pa |
| Target power: | 1.0–2.0 kW |
| Bias voltage: | Ground to −300 V |

On the surface of the titanium plating layer formed on this base article surface, a titanium carbide plating layer was formed in a thickness of 0.4 μm by a sputtering method under the layer formation conditions below.

<Layer Formation Conditions>

| | |
|---|---|
| Target: | Titanium |
| Sputtering gas: | Gas mixture of argon and $C_2H_4$ |
| Layer formation pressure: | 0.2–0.9 Pa |
| Target power: | 1.0–2.0 kW |
| Bias voltage: | Ground to −300 V |

On the surface of the titanium carbide plating layer formed on this base article, a white-colored stainless steel coating layer was formed in a thickness of 0.5 μm by a sputtering method under the layer formation conditions below to obtain a watchband.

<Layer Formation Conditions>

| | |
|---|---|
| Target: | Austenitic stainless steel SUS310S |
| Sputtering gas: | Argon gas |
| Layer formation pressure: | 0.2–0.9 Pa |
| Target power: | 1.0–2.0 kW |
| Bias voltage: | Ground to −300 V |

The resulting watchband was tested for the corrosion resistance of the plating layer according to the aforementioned method. The rating number was not lower than 9.8, showing that the corrosion resistance was "good".

Example 25

A watchband was produced in the same manner as in Example 24 except that a gas mixture of argon and $CH_4$ was used as the sputtering gas in formation of the titanium carbide plating layer by sputtering.

The resulting watchband was tested for the corrosion resistance of the plating layer according to the aforementioned method. The rating number was not lower than 9.8, showing that the corrosion resistance was "good".

Example 26

A watchband was produced in the same manner as in Example 24 except that a gas mixture of argon and $C_6H_6$ was used as the sputtering gas in formation of the titanium carbide plating layer by sputtering.

The resulting watchband was tested for the corrosion resistance of the plating layer according to the aforementioned method. The rating number was not lower than 9.8, showing that the corrosion resistance was "good".

Example 27

A base article of a watchcase was shaped from zinc by machining. This base article was washed and degreased with an organic solvent.

The watchcase base article was immersed in a plating solution having the composition below. A copper-tin alloy plating layer (alloy metal ratio: Cu, 75 wt %; Sn, 20 wt %; and Zn, 5 wt %) was formed in a thickness of 3 μm on the base article surface by electroplating under the plating conditions below. The plated article was washed with water.

<<Copper-Tin Alloy Plating>>

<Plating Solution Composition>

| | |
|---|---|
| Copper cyanide | 15 g/lit. (in terms of Cu) |
| Sodium stannate | 15 g/lit. (in terms of Sn) |
| Zinc cyanide | 1 g/lit. (in terms of Zn) |
| KOH | 20 g/lit. |
| KCN (free) | 30 g/lit. |
| Brightener B (trade name) | 10 ml/lit. |
| (produced by Nippon Shin-Kinzoku K. K.) | |

<Plating Conditions>

| | |
|---|---|
| pH | 12.5 (at 50° C.) |
| Solution temperature | 50° C. |
| Current density (Dk) | 2.0 A/dm² |
| Electrolysis time | 12 minutes |

Stirring of plating solution Rotation of rack of cathode rocker type

This watchcase base article having the copper-tin alloy plating layer was immersed in a plating solution having the composition below. A copper-tin-zinc alloy plating layer (alloy metal ratio: Cu, 50 wt %; Sn, 35 wt %, and Zn, 15 wt %) was formed in a thickness of 2.5 μm on the copper-tin alloy plating layer surface by electroplating under the plating conditions below. The plated base article was washed with water.

<<Copper-Tin-Zinc Alloy Plating>>

<Plating Solution Composition>

| | |
|---|---|
| Copper cyanide | 8.5 g/lit. (in terms of Cu) |
| Sodium stannate | 34.0 g/lit. (in terms of Sn) |
| Zinc cyanide | 1.0 g/lit. (in terms of Zn) |
| KOH | 20 g/lit. |
| KCN (free) | 50 g/lit. |
| Brightener 1 - 1 (trade name) | 0.5 ml/lit. |
| (produced by Degussa Japan Co., Ltd.) | |
| Brightener 2 (trade name) | 0.5 ml/lit. |
| (produced by Degussa Japan Co., Ltd.) | |

<Plating Conditions>

| pH | 13.0 (at 60° C.) |
| Solution temperature | 60.0° C. |
| Current density (Dk) | 2.0 A/dm² |
| Electrolysis time | 15 minutes |

This watchcase article having the copper-tin-zinc alloy plating layer was immersed in a plating solution having the composition below. A gold strike plating layer (flash plating) was formed in a thickness of 0.1–0.2 μm on the copper-tin-zinc alloy plating layer surface by electroplating under the plating conditions below. The plated base article was washed with water.

<<Gold Strike Plating>>
<Plating Solution Composition>

| Auric potassium cyanide (KAu(CN)₄) | 2.0 g/lit. (in terms of Au) |
| Sulfuric acid (aqueous 10% solution) | 10 g/lit. |

<Plating Conditions>

| pH | 0.3 to 1 |
| Solution temperature | Room temperature |
| Current density (DK) | 3 A/dm² |
| Electrolysis time | 15 seconds |

This plated base article was set in a sputtering apparatus, and the surface of the base article was cleaned by bombard cleaning in an argon atmosphere.

On the surface of the gold strike plating layer formed on this base article, a titanium plating layer was formed in a thickness of 0.2–0.5 μm by a sputtering method under the layer formation conditions below.

<Layer Formation Conditions>

| Target: | Titanium |
| Sputtering gas: | Argon gas |
| Layer formation pressure: | 0.2–0.9 Pa |
| Target power: | 1.0–2.0 kW |
| Bias voltage: | Ground to −300 V |

On the surface of the titanium plating layer formed on this base article surface, a white-colored stainless steel coating layer was formed in a thickness of 0.3 μm by a sputtering method under the layer formation conditions below to obtain a watchcase.

<Layer Formation Conditions>

| Target: | Austenitic stainless steel SUS310S |
| Sputtering gas: | Argon gas |
| Layer formation pressure: | 0.2–0.9 Pa |
| Target power: | 1.0–2.0 kW |
| Bias voltage: | Ground to −300 V |

The resulting watchcase was tested for the corrosion resistance of the plating layer according to the aforementioned method. The rating number was not lower than 9.8, showing that the corrosion resistance was "good".

Example 28

A base article of a watchband was shaped from brass by machining. The base article was washed and degreased with an organic solvent.

This base article was immersed in a plating solution having the composition below. A nickel strike plating layer (flash plating) was formed in a thickness of 0.1–0.2 μm on the base article surface by electroplating under the plating conditions below. The plated article was washed with water.

<<Nickel Strike Plating>>
<Plating Solution Composition>

| Nickel chloride | 180 g/lit. |
| Hydrochloric acid | 100 g/lit. |

<Plating Conditions>

| pH | 0.3 to 1 |
| Solution temperature | Room temperature |
| Current density (Dk) | 3–5 A/dm² |
| Time | 30–60 seconds |

This watchband base article having a nickel strike plating layer was immersed in a plating solution having the composition below. A nickel plating layer was formed in a thickness of 2 μm on the nickel strike plating layer surface by electroplating under the plating conditions below. The plated base article was washed with water.

<<Nickel Plating>>
<Plating Solution Composition>

| Nickel sulfate | 250 g/lit. |
| Nickel chloride | 75 g/lit. |
| Boric acid | 50 g/lit. |
| Brightener (Brightener #61, produced by Ebara-Udylite Co., Ltd.) | 0.5 ml/lit. |

<Plating Conditions>

| pH | 3.6–4.0 |
| Solution temperature | 40–50° C. |
| Current density (Dk) | 3 A/dm² |

This watchband base article having a nickel plating layer was immersed in a plating solution having the composition below. A nickel-phosphorus alloy plating layer was formed in a thickness of 2 μm on the nickel plating layer surface by electroplating under the plating conditions below. The plated base article was washed with water.

<<Nickel-Phosphorus Alloy Plating>>
<Plating Solution Composition>

| Nickel sulfate | 40–50 g/lit. |
| Nickel hydroxide | 10–20 g/lit. |
| Sodium hypophosphite | 3–10 g/lit. |
| Phosphoric acid | 10–20 ml/lit. |
| Sodium citrate | 30–50 g/lit. |

<Plating Conditions>

| | |
|---|---|
| pH | 2.6–3.2 |
| Solution temperature | 55° C. |
| Current density (Dk) | 2 A/dm$^2$ |

This watchband base article having the nickel-phosphorus alloy plating layer was immersed in a plating solution having the composition below. A palladium strike plating layer (flash plating) was formed in a thickness of 0.2 μm on the nickel-phosphorus alloy plating layer surface by electroplating under the plating conditions below. The plated base article was washed with water, and dried.

<<Palladium Strike Plating>>
<Plating Solution Composition>

| | |
|---|---|
| Pure palladium | 1–3 g/lit. |

<Plating Conditions>

| | |
|---|---|
| pH | 8 |
| Solution temperature | 32° C. |
| Current density (Dk) | 3–5 A/dm$^2$ |
| Time | 30 seconds |

This plated base article was set in a sputtering apparatus, and the surface of the base article was cleaned by bombard cleaning in an argon atmosphere.

On the surface of the palladium strike plating layer formed on this base article surface, a white-colored stainless steel coating layer was formed in a thickness of 0.5 μm by a sputtering method under the layer formation conditions below.

<Layer Formation Conditions>

| | |
|---|---|
| Target: | Austenitic stainless steel SUS310S |
| Sputtering gas: | Argon gas |
| Layer formation pressure: | 0.2–0.9 Pa |
| Target power: | 1.0–2.0 kW |
| Bias voltage: | Ground to −300 V |

Then in this apparatus, the above nickel-phosphorus alloy plating layer was subjected to heat treatment (age hardening treatment) at 250° C. for 30 minutes to obtain a watchband.

The obtained watchband had a surface hardness of 650 (HV; Vickers hardness tester, 25 g, impression time of 10 seconds).

Another watchband was produced in the same manner as above by forming a white-colored stainless steel coating layer of 2 μm thick and heat-treating the nickel-phosphorus alloy plating layer in the same manner as above.

This watchband had a surface hardness of 650 (HV; Vickers hardness tester, 25 g, impression time of 10 seconds).

These watchbands were immersed in a plating solution having the composition below. A palladium flash plating layer was formed in a thickness of 0.2 μm on the stainless steel coating layer surface by electroplating under the plating conditions below. The plated base article was washed with water, and dried.

<<Palladium Flash Plating>>
<Plating Solution Composition>

| | |
|---|---|
| Pure palladium | 1–3 g/lit. |

<Plating Conditions>

| | |
|---|---|
| pH | 8 |
| Solution temperature | 32° C. |
| Current density (Dk) | 3–5 A/dm$^2$ |
| Time | 30 seconds |

The resulting watchbands were tested for the corrosion resistance of the plating layer according to the aforementioned method. The rating numbers were not lower than 9.8, showing that the corrosion resistance was "good".

Example 29

A base article of a watchband was shaped from brass by machining. This base article was washed and degreased with an organic solvent.

The watchband base article was immersed in a plating solution having the composition below. A copper-tin alloy plating layer (alloy metal ratio: Cu, 75 wt %; Sn, 20 wt %; and Zn, 5 wt %) was formed in a thickness of 3 μm on the base article surface by electroplating under the plating conditions below. The plated article was washed with water.

<<Copper-Tin Alloy Plating>>
<Plating Solution Composition>

| | |
|---|---|
| Copper cyanide | 15 g/lit. (in terms of Cu) |
| Sodium stannate | 15 g/lit. (in terms of Sn) |
| Zinc cyanide | 1 g/lit. (in terms of Zn) |
| KOH | 20 g/lit. |
| KCN (free) | 30 g/lit. |
| Brightener B (trade name) | 10 ml/lit. |
| (produced by Nippon Shin-Kinzoku K. K.) | |

<Plating Conditions>

| | |
|---|---|
| pH | 12.5 (at 50° C.) |
| Solution temperature | 50° C. |
| Current density (Dk) | 2.0 A/dm$^2$ |
| Electrolysis time | 12 minutes |
| Stirring of plating solution | Rotation of rack of cathode rocker type |

This watchband base article having the copper-tin alloy plating layer was immersed in a plating solution having the composition below. A copper-tin-zinc alloy plating layer (alloy metal ratio: Cu, 50 wt %; Sn, 35 wt %, and Zn, 15 wt %) was formed in a thickness of 2.5 μm on the copper-tin alloy plating layer surface by electroplating under the plating conditions below. The plated base article was washed with water.

<<Copper-Tin-Zinc Alloy Plating>>
<Plating Solution Composition>

| | |
|---|---|
| Copper cyanide | 8.5 g/lit. (in terms of Cu) |
| Sodium stannate | 34.0 g/lit. (in terms of Sn) |
| Zinc cyanide | 1.0 g/lit. (in terms of Zn) |
| KOH | 20 g/lit. |
| KCN (free) | 50 g/lit. |
| Brightener 1-1 (trade name) (produced by Degussa Japan Co., Ltd.) | 0.5 ml/lit. |
| Brightener 2 (trade name) (produced by Degussa Japan Co., Ltd.) | 0.5 ml/lit. |

<Plating Conditions>

| | |
|---|---|
| pH | 13.0 (at 60° C.) |
| Solution temperature | 60.0° C. |
| Current density (Dk) | 2.0 A/dm$^2$ |
| Electrolysis time | 15 minutes |

This watchband base article having the copper-tin-zinc alloy plating layer was immersed in a plating solution having the composition below. A palladium strike plating layer (flash plating) was formed in a thickness of 0.2 μm on the copper-tin-zinc alloy plating layer surface by electroplating under the plating conditions below. The plated base article was washed with water.

<<Palladium Strike Plating>>
<Plating Solution Composition>

| | |
|---|---|
| Pure palladium | 1–3 g/lit. |

<Plating Conditions>

| | |
|---|---|
| pH | 8 |
| Solution temperature | 32° C. |
| Current density (Dk) | 3–5 A/dm$^2$ |
| Time | 30 seconds |

This plated base article was set in a sputtering apparatus, and the surface of the base article was cleaned by bombard cleaning in an argon atmosphere.

On the surface of the palladium strike plating layer formed on this base article surface, a white-colored stainless steel coating layer was formed in a thickness of 1.0 μm by a sputtering method under the layer formation conditions below to obtain a watchband.

<Layer Formation Conditions>

| | |
|---|---|
| Target: | Austenitic stainless steel SUS310S |
| Sputtering gas: | Argon gas |
| Layer formation pressure: | 0.2–0.9 Pa |
| Target power: | 1.0–2.0 kW |
| Bias voltage: | Ground to −300 V |

This watchband was immersed in a plating solution having the composition below. A palladium flash plating layer was formed in a thickness of 0.2 μm on the stainless steel plating layer surface by electroplating under the plating conditions below. The plated base article was washed with water and dried.

<<Palladium Flash Plating>>
<Plating Solution Composition>

| | |
|---|---|
| Pure palladium | 1–3 g/lit. |

<Plating Conditions>

| | |
|---|---|
| pH | 8 |
| Solution temperature | 32° C. |
| Current density (Dk) | 3–5 A/dm$^2$ |
| Time | 30 seconds |

The resulting watchband was tested for the corrosion resistance of the plating layer according to the aforementioned method. The rating number was not lower than 9.8, showing that the corrosion resistance was "good".

The personal ornaments (of the present invention) obtained in the above Examples 1–29 were evaluated for abrasion resistance with an abrasion resistance tester NUS-ISO-2 (trade name, manufactured by Suga Shikenki K. K.) according to the procedure described below.

As the evaluation standard for the abrasion resistance of the personal ornaments derived in Examples 1–29, a conventional personal ornament sample was prepared which has been on the market and has not caused any complaints. Specifically, a brass base article having a polished surface of surface roughness (Ra) of 0.05–0.5 μm and having a thickness of 1 mm was coated with a nickel plating layer of 3 μm thick and a palladium-nickel alloy plating layer of 1 μm thick successively as the underlying plating layers and was further coated with a gold-nickel alloy plating layer of 0.8 μm thick and gold-iron alloy plating layer of 0.2 μm thick successively as the finish-plating layers (hereinafter referred to as HGP).

Table 1 shows the test results. In the abrasion resistance tests, none of the personal ornaments of Examples 1–29 caused the exposure of the underlying plating layer even after test abrasion of 200 times.

<Abrasion Resistance Test>

As shown in FIG. 1, a test piece 1 having a coating layer is fixed with a test piece-pressing plate 2 and test piece-pressing screws 3 at the aperture portion of the test piece mount 4 with the coated face side directed downward. An abrasive paper sheet (not shown in the drawing) is attached to the abrasion wheel 5. A load is applied upward to the abrasion wheel 5 by means of a balance mechanism not shown in the drawing to press the abrasive paper sheet against the test piece 1.

In this state, the test piece mount 4 is moved reciprocatingly by a mechanism of converting the rotation of a motor not shown in the drawing to reciprocation movement. The abrasion wheel 5 is rotated intermittently in the arrow direction by 0.9 degree per each one reciprocation movement of the test piece mount 4. By this rotation of the abrasion wheel, the abrasion paper sheet on the abrasion wheel 5 is pressed at the unabraded fresh portion against the test piece 1. The times of the reciprocation of the test piece mount 4 can be automatically preset to stop the abrasion test at a prescribed times of the reciprocation.

In practice of the abrasion test, a wrapping film (having $Cr_2O_3$ particles of particle diameter of 0.5 μm on the film surface) was used as the abrasion paper sheet; the contact load of the abrasion paper sheet against the test piece 1 was set at 500 g; and the reciprocation of the test piece mount 4 was conducted 200 times. At the time when the underlying plating layer of the test piece 1 came to be exposed, the abrasion test was stopped.

The abrasion resistance in the present invention was evaluated in comparison with the abrasion resistance level of the aforementioned HGP which has been on the market and has not caused any complaints. The level of the abrasion resistance equal to or higher than that of the HGP is evaluated to be "good", and the one lower than that is evaluated to be "poor".

TABLE 1

| | Number of test pieces having underlying plating layer exposed Number of repetition of abrasion | | Evaluation of abrasion resistance |
|---|---|---|---|
| | 200 to 250 times | 251 to 300 times | |
| Example 1 | 1 | 4 | good |
| Example 2 | 0 | 5 | good |
| Example 3 | 0 | 5 | good |
| Example 4 | 0 | 5 | good |
| Example 5 | 0 | 5 | good |
| Example 6 | 1 | 4 | good |
| Example 7 | 0 | 5 | good |
| Example 8 | 0 | 5 | good |
| Example 9 | 0 | 5 | good |
| Example 10 | 0 | 5 | good |
| Example 11 | 0 | 5 | good |
| Example 12 | 0 | 5 | good |
| Example 13 | 0 | 5 | good |
| Example 14 | 0 | 5 | good |
| Example 15 | 0 | 5 | good |
| Example 16 | 0 | 5 | good |
| Example 17 | 0 | 5 | good |
| Example 18 | 1 | 4 | good |
| Example 19 | 0 | 5 | good |
| Example 20 | 1 | 4 | good |
| Example 21 | 0 | 5 | good |
| Example 22 | 0 | 5 | good |
| Example 23 | 1 | 4 | good |
| Example 24 | 0 | 5 | good |
| Example 25 | 0 | 5 | good |
| Example 26 | 0 | 5 | good |
| Example 27 | 0 | 5 | good |
| Example 28 | 0 | 5 | good |
| Example 29 | 0 | 5 | good |
| Reference (HGP) | 2 | 3 | — |

(Note)
Number of test sample pieces = 5

What is claimed is:

1. A personal ornament having a white coating layer comprising:
   a base article of the personal ornament made of a tungsten carbide and tantalum carbide, and
   a white-colored stainless steel coating layer formed by a dry plating process on at least a part of the surface of the base article.

2. The personal ornament having a white coating layer according to claim 1, wherein a white-colored noble metal coating layer is formed in a thickness ranging from 0.04 to 0.3 μm by a dry plating process on the surface of the stainless steel coating layer.

3. The personal ornament having a white coating layer according to claim 2, wherein the white-colored noble metal coating layer is a coating layer formed by a dry plating process and composed of a noble metal selected from the group consisting of palladium, platinum, rhodium, gold alloys, silver, and silver alloys.

4. The personal ornament having a white coating layer according to claim 1, wherein the white-colored stainless steel coating layer is composed of an austenitic stainless steel having a composition of 0.01–0.12 vol % of carbon, 0.1–1.0 vol % of silicon, 1.0–2.5 vol % of manganese, 8–22 vol % of nickel, and 15–26 vol % of chromium.

5. The personal ornament having a white coating layer according to claim 1, wherein the white-colored stainless steel coating layer is composed of a nickel-free ferritic stainless steel having a composition of 0.01–0.12 vol % of carbon, 0.1–1.0 vol % of silicon, 1.0–2.5 vol % of manganese, 14–20 vol % of chromium, and 0.4–2.5 vol % of molybdenum.

6. The personal ornament having a white coating layer according to claim 1, wherein the white-colored stainless steel coating layer is formed by a dry plating process selected from a sputtering method, an arc evaporation method, or an ion-plating method.

7. The personal ornament having a white coating layer according to claim 1, wherein the stainless steel coating layer has a thickness ranging from 0.1 to 2.0 μm.

8. The personal ornament having a white coating layer according to claim 1, wherein at least one plating layer different in color tone from the white-colored stainless steel coating layer is formed by a dry plating process on the stainless steel coating layer formed by a dry plating process.

9. The personal ornament having a white coating layer according to claim 8, wherein the plating layer different from the stainless steel coating layer is at least one coating layer composed of gold, gold alloys, titanium nitride, and zirconium nitride.

10. A personal ornament having a white coating layer comprising:
    a base article of the personal ornament made of a nonferrous metal,
    an underlying plating layer formed on the surface of the base article, and
    a white-colored stainless steel coating layer formed by a dry plating process on at least a part of the surface of the underlying plating layer.

11. The personal ornament having a white coating layer according to claim 10, wherein the base article of the personal ornament is made of a nonferrous metal selected from the group consisting of copper, copper alloys, aluminum, aluminum alloys, zinc, zinc alloys, magnesium, and magnesium alloys.

12. The personal ornament having a white coating layer according to claim 10, wherein the underlying plating layer has a multilayer structure constituted of at least one plating layer formed by a wet plating process and at least one plating layer formed by a dry plating process.

13. The personal ornament having a white coating layer according to claim 12, wherein the underlying plating layer comprises a coating layer which is formed by a wet plating process and is composed of at least one metal selected from the group consisting of gold, copper, nickel, chromium, tin, palladium, nickel-phosphorus alloys, nickel alloys excluding nickel-phosphorus alloys, copper-tin-palladium alloys, copper alloys excluding copper-tin-palladium alloys, tin alloys excluding copper-tin-palladium alloys, and palladium alloys excluding copper-tin-palladium alloys.

14. The personal ornament having a white coating layer according to claim 12, wherein the underlying plating layer is a coating layer formed by a wet plating process and composed of at least one nickel-free metal selected from the group consisting of gold, copper, chromium, tin, palladium, copper-tin-palladium alloys, copper alloys excluding copper-tin-palladium alloys, tin alloys excluding copper-tin-palladium alloys, and palladium alloys excluding copper-tin-palladium alloys.

15. The personal ornament having a white coating layer according to claim 12, wherein the underlying plating layer is a coating layer formed by a dry plating process and is composed of titanium carbide, zirconium carbide, or tantalum carbide.

16. The personal ornament having a white coating layer according to claim 10, wherein the underlying plating layer comprises a coating layer which is formed by a wet plating process and is composed of at least one metal selected from the group consisting of gold, copper, nickel, chromium, tin, palladium, nickel-phosphorus alloys, nickel alloys excluding nickel-phosphorus alloys, copper-tin-palladium alloys, copper alloys excluding copper-tin-palladium alloys, tin alloys excluding copper-tin-palladium alloys, and palladium alloys excluding copper-tin-palladium alloys.

17. The personal ornament having a white coating layer according to claim 16, wherein the underlying plating layer includes the nickel-phosphorus alloy plating layer as the underlying plating layer which is a hard coating layer having been treated for age hardening.

18. The personal ornament having a white coating layer according to claim 10, wherein the underlying plating layer is a coating layer formed by a wet plating process and composed of at least one nickel-free metal selected from the group consisting of gold, copper, chromium, tin, palladium, copper-tin-palladium alloys, copper alloys excluding copper-tin-palladium alloys, tin alloys excluding copper-tin-palladium alloys, and palladium alloys excluding copper-tin-palladium alloys.

19. The personal ornament having a white coating layer according to claim 10, wherein the underlying plating layer is a coating layer formed by a dry plating process and is composed of titanium carbide, zirconium carbide, or tantalum carbide.

20. The personal ornament having a white coating layer according to claim 10, wherein the underlying plating layer has an entire thickness ranging from 0.2 to 30 μm.

21. The personal ornament having a white surface coating layer according to claim 10, wherein the white-colored stainless steel coating layer is composed of an austenitic stainless steel having a composition of 0.01–0.12 vol % of carbon, 0.1–1.0 vol % of silicon, 1.0–2.5 vol % of manganese, 8–22 vol % of nickel, and 15–26 vol % of chromium.

22. The personal ornament having a white coating layer according to claim 10, wherein the white-colored stainless steel coating layer is composed of a nickel-free ferritic stainless steel having a composition of 0.01–0.12 vol % of carbon, 0.1–1.0 vol % of silicon, 1.0–2.5 vol % of manganese, 14–20 vol % of chromium, and 0.4–2.5 vol % of molybdenum.

23. The personal ornament having a white coating layer according to claim 10, wherein a white-colored noble metal coating layer is formed in a thickness ranging from 0.04 to 0.3 μm by a dry plating process on the surface of the stainless steel coating layer.

24. A process for producing a personal ornament having a white coating layer comprising the steps of:
forming a base article of the personal ornament by machining a metal;
washing and degreasing the surface of the base article;
setting the base article in a dry plating apparatus selected from sputtering systems, arc evaporation systems, and ion-plating systems, and cleaning the base article by bombard cleaning in an argon gas atmosphere; and
forming a white-colored stainless steel coating layer by a dry plating process on the surface of the base article.

25. The process for producing a personal ornament having a white coating layer according to claim 24, which further comprises, after the formation of the white-colored stainless steel coating layer, the step of forming a white-colored noble metal coating layer in a thickness ranging from 0.04 to 0.3 μm by a dry plating process on the surface of the stainless steel coating layer.

26. The process for producing a personal ornament having a white coating layer according to claim 25, wherein the white-colored noble metal coating layer is a coating layer formed by a dry plating process from a noble metal selected from the group consisting of palladium, platinum, rhodium, gold alloys, silver and silver alloys.

27. The process for producing a personal ornament having a white coating layer according to claim 24, wherein the metal employed for forming the base article of the personal ornament is tungsten carbide or tantalum carbide.

28. The process for producing a personal ornament having a white coating layer according to claim 24, wherein the white-colored stainless steel coating layer is composed of an austenitic stainless steel having a composition of 0.01–0.12 vol % of carbon, 0.1–1.0 vol % of silicon, 1.0–2.5 vol % of manganese, 8–22 vol % of nickel and 15–26 vol % of chromium; and is formed by a sputtering method, an arc evaporation method or an ion plating method.

29. The process for producing a personal ornament having a white coating layer according to claim 24, wherein the white-colored stainless steel coating layer is composed of a nickel-free ferritic stainless steel having a composition of 0.01–0.12 vol % of carbon, 0.1–1.0 vol % of silicon, 1.0–2.5 vol % of manganese, 14–20 vol % of chromium, and 0.4–2.5 vol % of molybdenum; and is formed by a sputtering method, an arc evaporation method, or an ion plating method.

30. The process for producing a personal ornament having a white coating layer according to claim 24, which further comprises,
after the step of forming a white-colored stainless steel coating layer on the surface of the base article,
at least once the steps of:
masking a part of the stainless steel coating layer,
forming a plating layer different in color tone from the stainless steel coating layer on the surface of the stainless steel coating layer and the surface of the mask by a dry plating process, and
removing the mask and the coating layer on the mask,
to thereby provide an outermost plating layer having a white-colored stainless steel coating layer portion and at least one plating layer portion different in color tone from the stainless steel coating layer.

31. The process for producing a personal ornament having a white coating layer according to claim 30, wherein the plating layer different in color tone from the stainless steel coating layer is at least one coating layer formed from a metal selected from the group consisting of gold, gold alloys, titanium nitride, hafnium nitride and zirconium nitride by a dry plating process selected from sputtering methods, arc evaporation methods, and ion plating methods.

32. A process for producing a personal ornament having a white coating layer comprising the steps of:
forming a base article of the personal ornament from a nonferrous metal by machining;
washing and degreasing the surface of the base article;
forming on the surface of the base article an underlying plating layer by a wet plating process or a dry plating process;

setting the base article having the underlying plating layer in a dry plating apparatus selected from sputtering systems, arc evaporation systems, and ion-plating systems, and cleaning the surface of the underlying plating layer by bombard cleaning in an argon gas atmosphere; and forming a white-colored stainless steel coating layer by a dry plating process on the surface of the underlying plating layer.

33. The process for producing a personal ornament having a white coating layer according to claim 32, wherein the nonferrous metal employed for forming the base article of the personal ornament is at least one nonferrous metal selected from the group consisting of copper, copper alloys, aluminum, aluminum alloys, zinc, zinc alloys, magnesium and magnesium alloys.

34. The process for producing a personal ornament having a white coating layer according to claim 32, wherein the underlying plating layer has a multilayer structure constituted of at least one plating layer formed by a wet plating process on the surface of the base article and at least one different plating layer formed thereon by a dry plating process.

35. The process for producing a personal ornament having a white coating layer according to claim 34, wherein at least one plating layer of multilayer structure of the underlying plating layer is formed by a wet plating process from at least one metal selected from the group consisting of gold, copper, nickel, chromium, tin, palladium, nickel-phosphorus alloys, nickel alloys excluding nickel-phosphorus alloys, copper-tin-palladium alloys, copper alloys excluding copper-tin-palladium alloys, tin alloys excluding copper-tin-palladium alloys, and palladium alloys excluding copper-tin-palladium alloys.

36. The process for producing a personal ornament having a white coating layer according to claim 34, wherein at least one plating layer of multilayer structure of the underlying plating layer is formed by a wet plating process from at least one nickel-free metal selected from the group consisting of gold, copper, chromium, tin, palladium, copper-tin-palladium alloys, copper alloys excluding copper-tin-palladium alloys, tin alloys excluding copper-tin-palladium alloys, and palladium alloys excluding copper-tin-palladium alloys.

37. The process for producing a personal ornament having a white coating layer according to claim 34, wherein at least one plating layer of multilayer structure of the underlying plating layer is formed from titanium carbide, zirconium carbide or tantalum carbide by a dry plating process.

38. The process for producing a personal ornament having a white coating layer according to claim 32, wherein the underlying plating layer is formed by a wet plating process from at least one metal selected from the group consisting of gold, copper, nickel, chromium, tin, palladium, nickel-phosphorus alloys, nickel alloys excluding nickel-phosphorus alloys, copper-tin-palladium alloys, copper alloys excluding copper-tin-palladium alloys, tin alloys excluding copper-tin-palladium alloys, and palladium alloys excluding copper-tin-palladium alloys.

39. The process for producing a personal ornament having a white coating layer according to claim 38, wherein the underlying plating layer includes the nickel-phosphorus alloy plating layer which is treated for age hardening at 200 to 450° C. for 20 to 60 minutes to harden the nickel-phosphorus alloy plating layer.

40. The process for producing a personal ornament having a white coating layer according to claim 32, wherein the underlying plating layer is formed by a wet plating process from at least one nickel-free metal selected from the group consisting of gold, copper, chromium, tin, palladium, copper-tin-palladium alloys, copper alloys excluding copper-tin-palladium alloys, tin alloys excluding copper-tin-palladium alloys, and palladium alloys excluding copper-tin-palladium alloys.

41. The process for producing a personal ornament having a white coating layer according to claim 32, wherein the underlying plating layer is formed from titanium carbide, zirconium carbide or tantalum carbide by a dry plating process.

42. The process for producing a personal ornament having a white coating layer according to claim 32, wherein the underlying plating layer has an entire thickness of ranging from 0.2 to 30 $\mu$m.

43. The process for producing a personal ornament having a white coating layer according to claim 32, which further comprises, after the formation of the white-colored stainless steel coating layer, the step of forming a white-colored noble metal coating layer in a thickness ranging from 0.04 to 0.3 $\mu$m by a dry plating process on the surface of the stainless steel coating layer.

44. The process for producing a personal ornament having a white coating layer according to claim 32, which further comprises, after the step of forming a white-colored stainless steel coating layer on the surface of the underlying coating layer, at least once the steps of:
  masking a part of the stainless steel coating layer,
  forming a plating layer different in color tone from the stainless steel coating layer on the surface of the stainless steel coating layer and the surface of the mask by a dry plating process, and
  removing the mask and the coating layer on the mask,
  to thereby provide an outermost plating layer having a white-colored stainless steel coating layer portion and at least one plating layer portion different in color tone from the stainless steel coating layer.

* * * * *

UNITED STATES PATENT AND TRADEMARK OFFICE
CERTIFICATE OF CORRECTION

PATENT NO. : 6,780,527 B2
DATED : August 24, 2004
INVENTOR(S) : Naoi et al.

It is certified that error appears in the above-identified patent and that said Letters Patent is hereby corrected as shown below:

Column 7,
Line 43, "from 1 to 5 m$\mu$" should read -- from 1 to 5 $\mu$m --

Column 50,
Line 62, "at a prescribed times" should read -- at prescribed times --

Signed and Sealed this

Twelfth Day of April, 2005

JON W. DUDAS
*Director of the United States Patent and Trademark Office*